US012568670B2

(12) United States Patent
Yu et al.

(10) Patent No.: US 12,568,670 B2
(45) Date of Patent: Mar. 3, 2026

(54) SELF-ALIGNED CONTACT STRUCTURES

(71) Applicant: Taiwan Semiconductor Manufacturing Co., Ltd., Hsinchu (TW)

(72) Inventors: Li-Zhen Yu, Hsinchu (TW); Lin-Yu Huang, Hsinchu (TW); Chia-Hao Chang, Hsinchu (TW); Cheng-Chi Chuang, Taipei (TW); Yu-Ming Lin, Hsinchu (TW); Chih-Hao Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/364,574

(22) Filed: Aug. 3, 2023

(65) Prior Publication Data

US 2024/0021707 A1 Jan. 18, 2024

Related U.S. Application Data

(62) Division of application No. 17/676,699, filed on Feb. 21, 2022, now Pat. No. 11,916,133, which is a
(Continued)

(51) Int. Cl.
| | |
|---|---|
| *H01L 29/66* | (2006.01) |
| *H01L 21/768* | (2006.01) |
| *H10D 64/01* | (2025.01) |

(52) U.S. Cl.
CPC ..... *H10D 64/021* (2025.01); *H01L 21/76832* (2013.01); *H01L 21/76834* (2013.01); *H10D 64/017* (2025.01)

(58) Field of Classification Search
CPC ........... H01L 29/6656; H01L 21/76832; H01L 21/76834; H01L 29/6654
See application file for complete search history.

(56) References Cited

U.S. PATENT DOCUMENTS

| | | | |
|---|---|---|---|
| 6,420,752 B1 * | 7/2002 | Ngo | ................. H01L 21/76897 365/185.26 |
| 9,520,362 B2 | 12/2016 | Lin et al. | |

(Continued)

FOREIGN PATENT DOCUMENTS

| | | |
|---|---|---|
| JP | 2002110819 A | 4/2002 |
| JP | 2008166682 | 7/2008 |

(Continued)

OTHER PUBLICATIONS ip.com search (Year: 2025).*

*Primary Examiner* — Zandra V Smith
*Assistant Examiner* — Andre C Stevenson
(74) *Attorney, Agent, or Firm* — HAYNES AND BOONE, LLP

(57) ABSTRACT

Semiconductor devices and methods of forming the same are provided. In one embodiment, a semiconductor device includes a gate structure sandwiched between and in contact with a first spacer feature and a second spacer feature, a top surface of the first spacer feature and a top surface of the second spacer feature extending above a top surface of the gate structure, a gate self-aligned contact (SAC) dielectric feature over the first spacer feature and the second spacer feature, a contact etch stop layer (CESL) over the gate SAC dielectric feature, a dielectric layer over the CESL, a gate contact feature extending through the dielectric layer, the CESL, the gate SAC dielectric feature, and between the first spacer feature and the second spacer feature to be in contact
(Continued)

with the gate structure, and a liner disposed between the first spacer feature and the gate contact feature.

20 Claims, 41 Drawing Sheets

Related U.S. Application Data division of application No. 16/895,604, filed on Jun. 8, 2020, now Pat. No. 11,257,926.

(56)                    References Cited

U.S. PATENT DOCUMENTS

| | | | |
|---|---|---|---|
| 9,613,856 B1 | 4/2017 | Yang et al. | |
| 9,716,032 B2 | 7/2017 | Tang et al. | |
| 9,972,529 B2 | 5/2018 | Yang et al. | |
| 10,163,691 B2 | 12/2018 | Shih et al. | |
| 10,170,322 B1 | 1/2019 | Cheng et al. | |
| 11,195,745 B2* | 12/2021 | Li | H01L 21/76224 |
| 2008/0128774 A1 | 6/2008 | Irani | |
| 2014/0154877 A1 | 6/2014 | Besser et al. | |
| 2014/0346575 A1 | 11/2014 | Chen | |
| 2015/0206754 A1* | 7/2015 | Horak | H10D 30/60 |
| | | | 257/288 |
| 2016/0133623 A1 | 5/2016 | Xie et al. | |
| 2017/0018628 A1* | 1/2017 | Greene | H01L 21/31144 |
| 2017/0345841 A1* | 11/2017 | Wu | H10B 43/30 |
| 2018/0069000 A1* | 3/2018 | Bergendahl | H01L 21/31144 |
| 2018/0145073 A1 | 5/2018 | Bentley et al. | |
| 2018/0151378 A1 | 5/2018 | Huang et al. | |
| 2018/0269306 A1* | 9/2018 | Bao | H01L 23/535 |
| 2018/0350675 A1 | 12/2018 | Chung et al. | |
| 2019/0006236 A1 | 1/2019 | Hsieh et al. | |
| 2019/0326416 A1* | 10/2019 | Huang | H10D 64/021 |
| 2019/0386107 A1 | 12/2019 | Xie et al. | |
| 2019/0393321 A1 | 12/2019 | Xu et al. | |
| 2020/0098922 A1* | 3/2020 | You | H01L 21/76829 |
| 2020/0105577 A1 | 4/2020 | Liang et al. | |
| 2020/0135886 A1 | 4/2020 | Greene et al. | |
| 2020/0152504 A1 | 5/2020 | Frougier | |
| 2020/0152509 A1 | 5/2020 | Greene | |
| 2020/0335594 A1* | 10/2020 | Zang | H10D 84/0147 |

FOREIGN PATENT DOCUMENTS

| | | |
|---|---|---|
| KR | 20130140231 | 12/2013 |
| KR | 20180118031 A | 10/2018 |
| KR | 20190024534 | 3/2019 |
| KR | 20200061238 A | 6/2020 |
| TW | 202005085 A | 1/2020 |

* cited by examiner

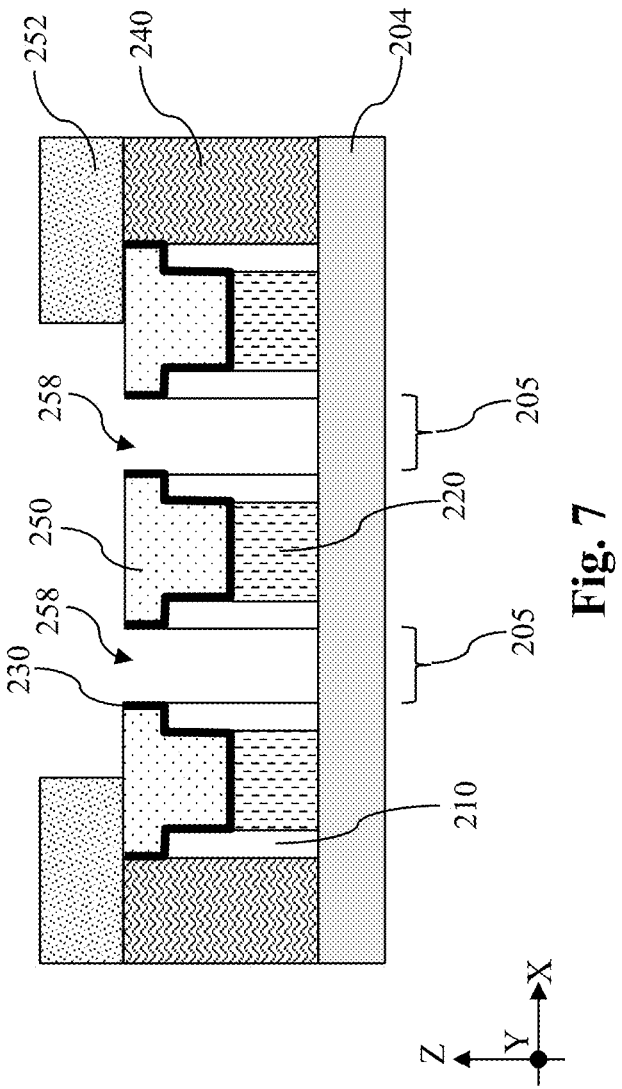
Fig. 7

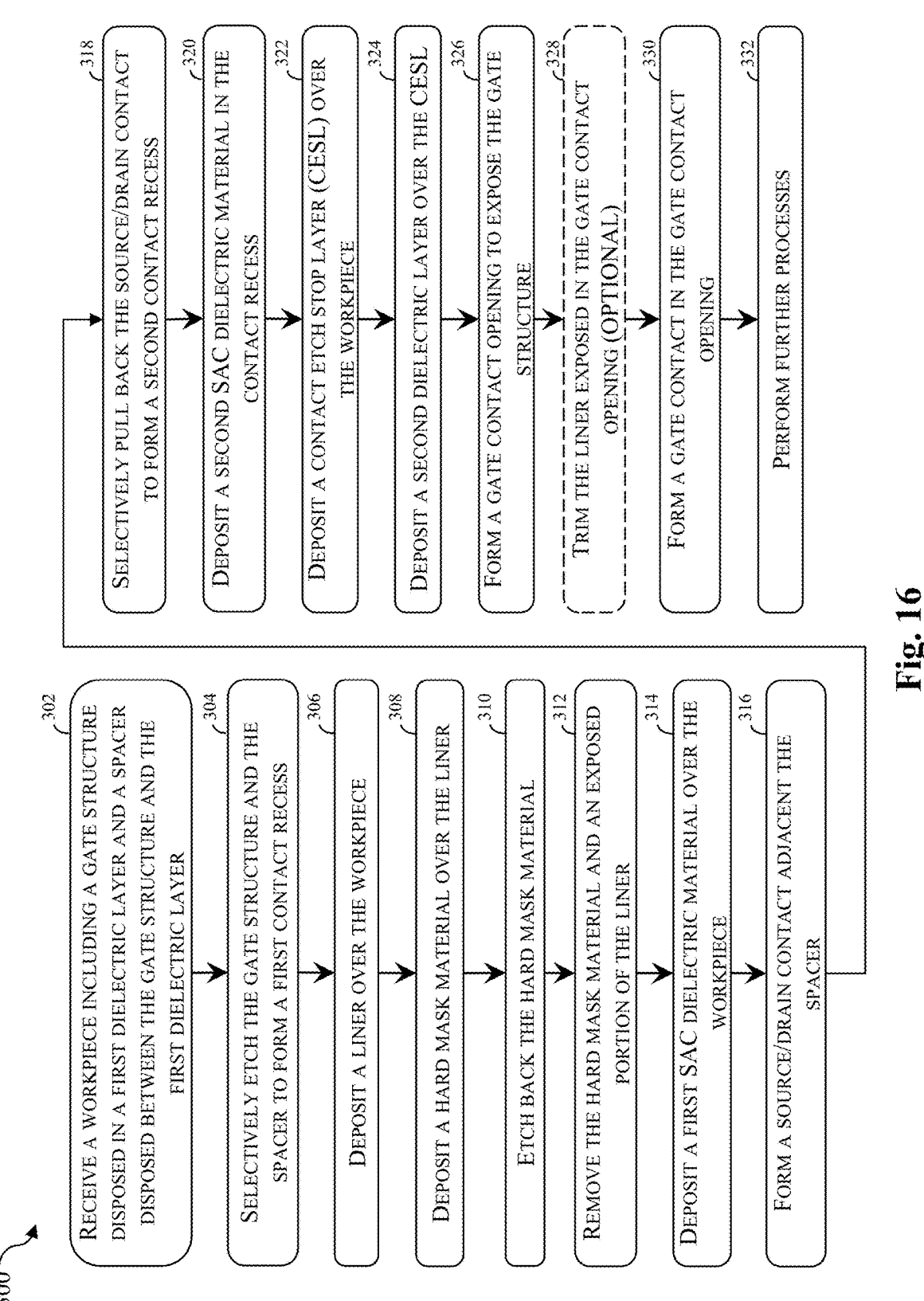

300

RECEIVE A WORKPIECE INCLUDING A GATE STRUCTURE DISPOSED IN A FIRST DIELECTRIC LAYER AND A SPACER DISPOSED BETWEEN THE GATE STRUCTURE AND THE FIRST DIELECTRIC LAYER — 302

SELECTIVELY ETCH THE GATE STRUCTURE AND THE SPACER TO FORM A FIRST CONTACT RECESS — 304

DEPOSIT A LINER OVER THE WORKPIECE — 306

DEPOSIT A HARD MASK MATERIAL OVER THE LINER — 308

ETCH BACK THE HARD MASK MATERIAL — 310

REMOVE THE HARD MASK MATERIAL AND AN EXPOSED PORTION OF THE LINER — 312

DEPOSIT A FIRST SAC DIELECTRIC MATERIAL OVER THE WORKPIECE — 314

FORM A SOURCE/DRAIN CONTACT ADJACENT THE SPACER — 316

SELECTIVELY PULL BACK THE SOURCE/DRAIN CONTACT TO FORM A SECOND CONTACT RECESS — 318

DEPOSIT A SECOND SAC DIELECTRIC MATERIAL IN THE CONTACT RECESS — 320

DEPOSIT A CONTACT ETCH STOP LAYER (CESL) OVER THE WORKPIECE — 322

DEPOSIT A SECOND DIELECTRIC LAYER OVER THE CESL — 324

FORM A GATE CONTACT OPENING TO EXPOSE THE GATE STRUCTURE — 326

TRIM THE LINER EXPOSED IN THE GATE CONTACT OPENING (OPTIONAL) — 328

FORM A GATE CONTACT IN THE GATE CONTACT OPENING — 330

PERFORM FURTHER PROCESSES — 332

Fig. 16

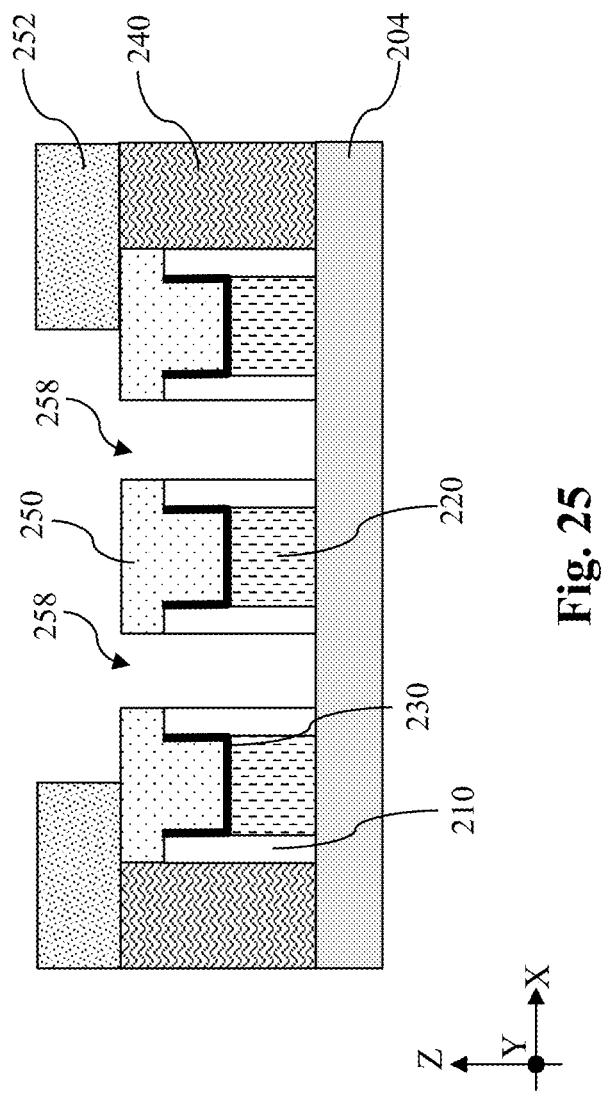
Fig. 25

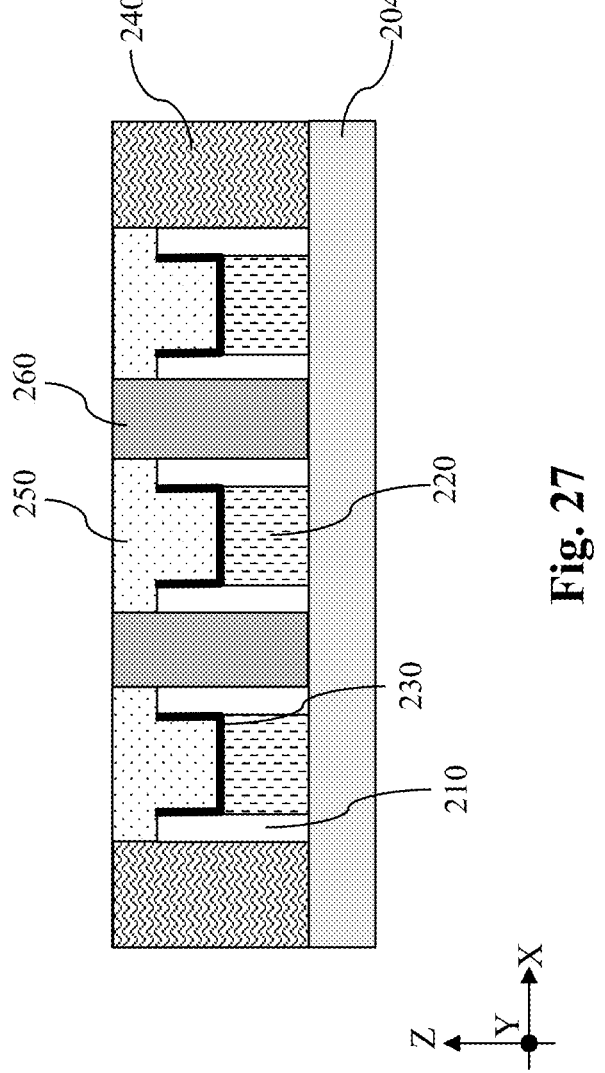
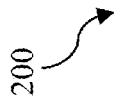
Fig. 27

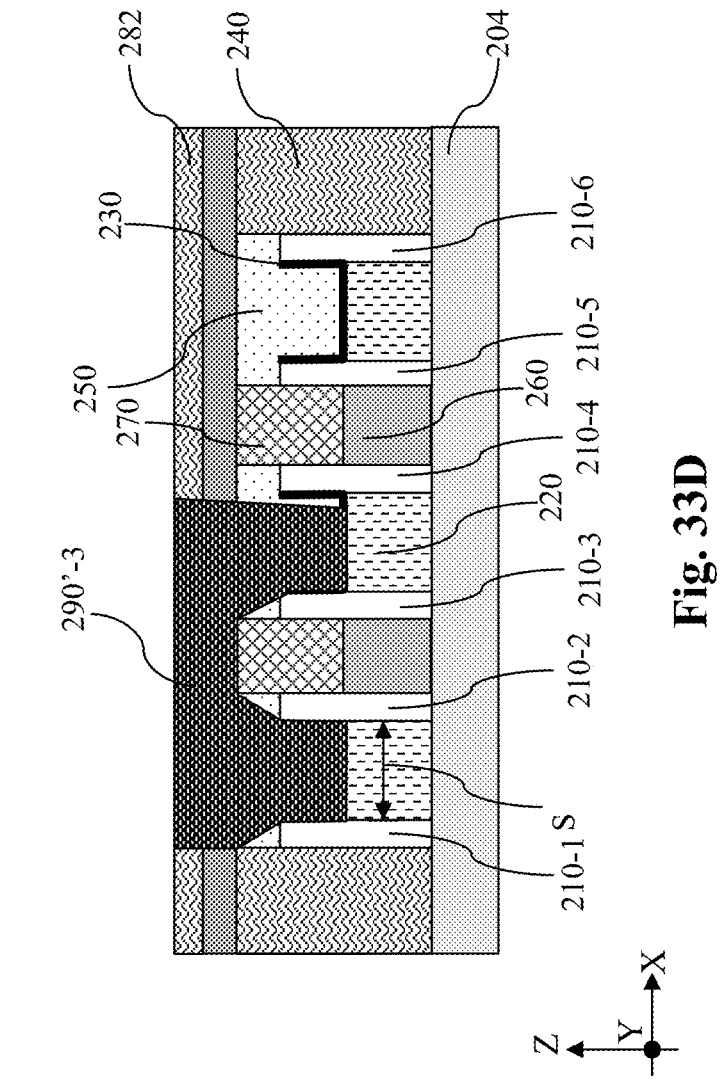
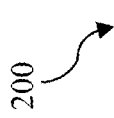
Fig. 33D

SELF-ALIGNED CONTACT STRUCTURES

PRIORITY DATA

This application is a divisional application of U.S. patent application Ser. No. 17/676,699, filed Feb. 21, 2022, which is a divisional application of U.S. patent application Ser. No. 16/895,604, filed Jun. 8, 2020, each of which is incorporated herein by reference in its entirety.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices, such as fin field-effect transistors (FinFETs) and gate-all-around (GAA) transistors, have been introduced in an effort to improve gate control by increasing gate-channel coupling, reduce OFF-state current, and reduce short-channel effects (SCEs). The three-dimensional structure of the multi-gate devices, allows them to be aggressively scaled while maintaining gate control and mitigating SCEs. However, even with the introduction of multi-gate devices, aggressive scaling down of IC dimensions has resulted in densely spaced gate structures and source/drain contacts. Formation of gate contacts and source/drain contact vias to these densely packed gate structures and source/drain contacts presents demands high overlay precisions as misalignment may cause electrical shorts, leakage or increased parasitic capacitance. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-13, 14A, 14B, 15A, 15B, 15C, and 15D are fragmentary cross-sectional views of a workpiece at various stages of fabrication according to the method in FIG. 1, according to one or more aspects of the present disclosure.

FIG. 16 is a flowchart of a method forming a gate contact in a semiconductor device, according to one or more aspects of the present disclosure.

FIGS. 17-31, 32A, 32B, 33A, 33B, 33C, and 33D are fragmentary cross-sectional views of a workpiece at various stages of fabrication according to the method in FIG. 16, according to one or more aspects of the present disclosure.

DETAILED DESCRIPTION

Figure 1:
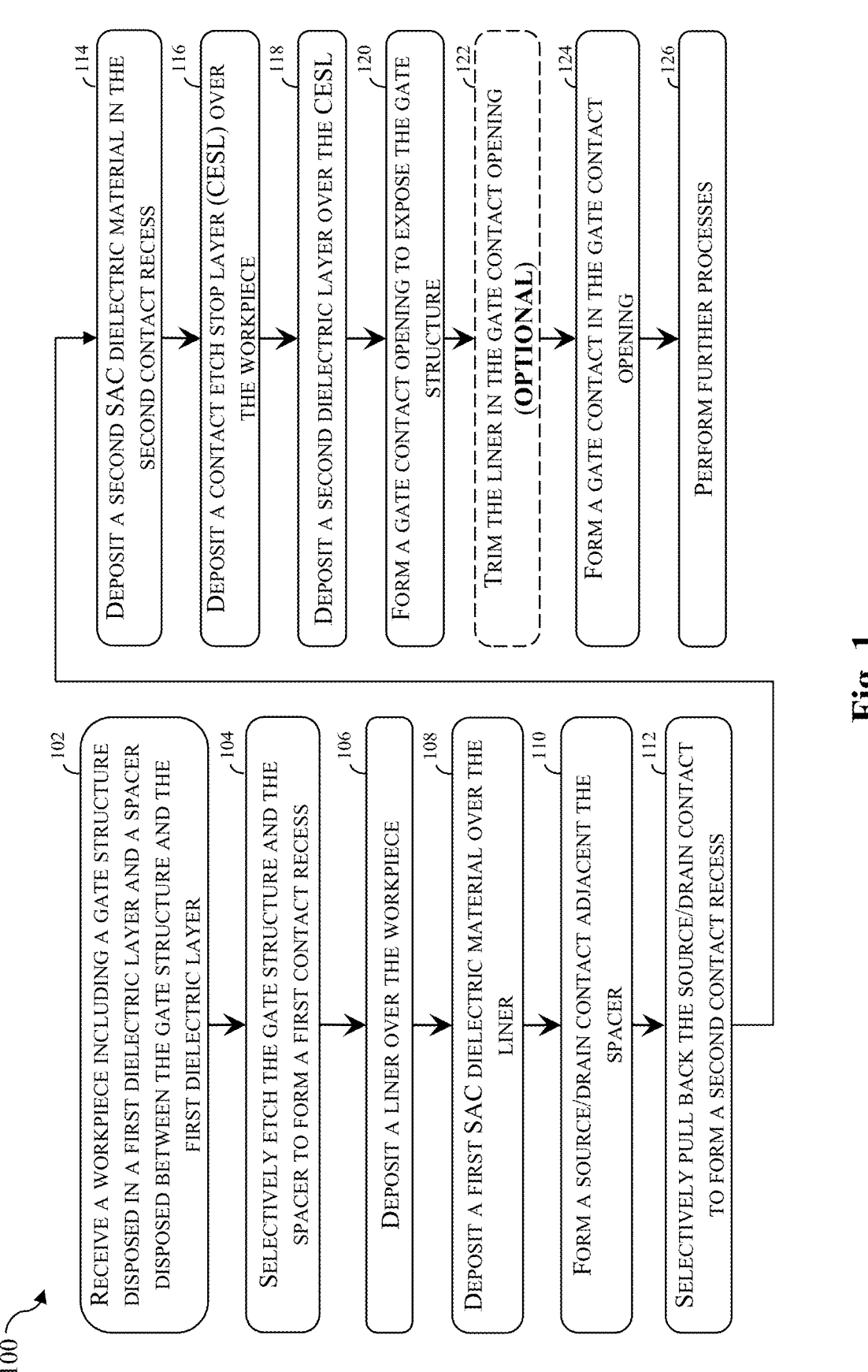
FIG. 1 is a flowchart of a method forming a gate contact in a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

This application relates to semiconductor device structures and methods of forming the same. Particularly, this application relates to self-aligned contact structures and methods. Methods of the present disclosure include depositing a liner over a gate structure and gate spacers before formation of self-aligned contact dielectric features. The material of the liner is selected to have different etching selectivity from the self-aligned contact dielectric feature such that the liner prevents or reduces damages to the gate spacers when forming a gate contact opening to the gate structure. By preventing or reducing damages to the gate spacers, increased parasitic capacitance, electrical shorts, or leakage due to loss of gate spacer may be reduced or prevented.

The various aspects of the present disclosure will now be described in more detail with reference to the figures. Specifically, FIG. 1 illustrates a method 100 for fabricating a semiconductor device from a workpiece 200, fragmentary cross-sectional views of which are illustrated in FIGS. 2-13, 14A, 14B, and 15A-15D. FIG. 16 illustrate a method 300 for fabricating a semiconductor device from a workpiece 200, fragmentary cross-sectional views of which are illustrated in FIGS. 17-31, 32A, 32B, and 33A-33D. Each of methods 100 and 300 is merely an example and is not intended to limit the present disclosure to what is explicitly illustrated therein. Additional steps can be provided before, during, and after method 100 or method 300, and some steps described can be replaced, eliminated, or moved around for additional embodiments of the method. Not all steps are described herein in detail for reasons of simplicity. Besides what are explicitly shown in figures of the present disclosure, the workpiece 200 may include additional transistors, bipolar junction transistors, resistors, capacitors, diodes, fuses, etc., but is simplified for a better understanding of the inventive concepts of the present disclosure. Throughout the present disclosure, like reference numerals denote like features unless otherwise excepted or described. Because a semiconductor device will be fabricated from the workpiece, the workpiece 200 may be referred to as a semiconductor device 200 in suitable context.

Figure 2:
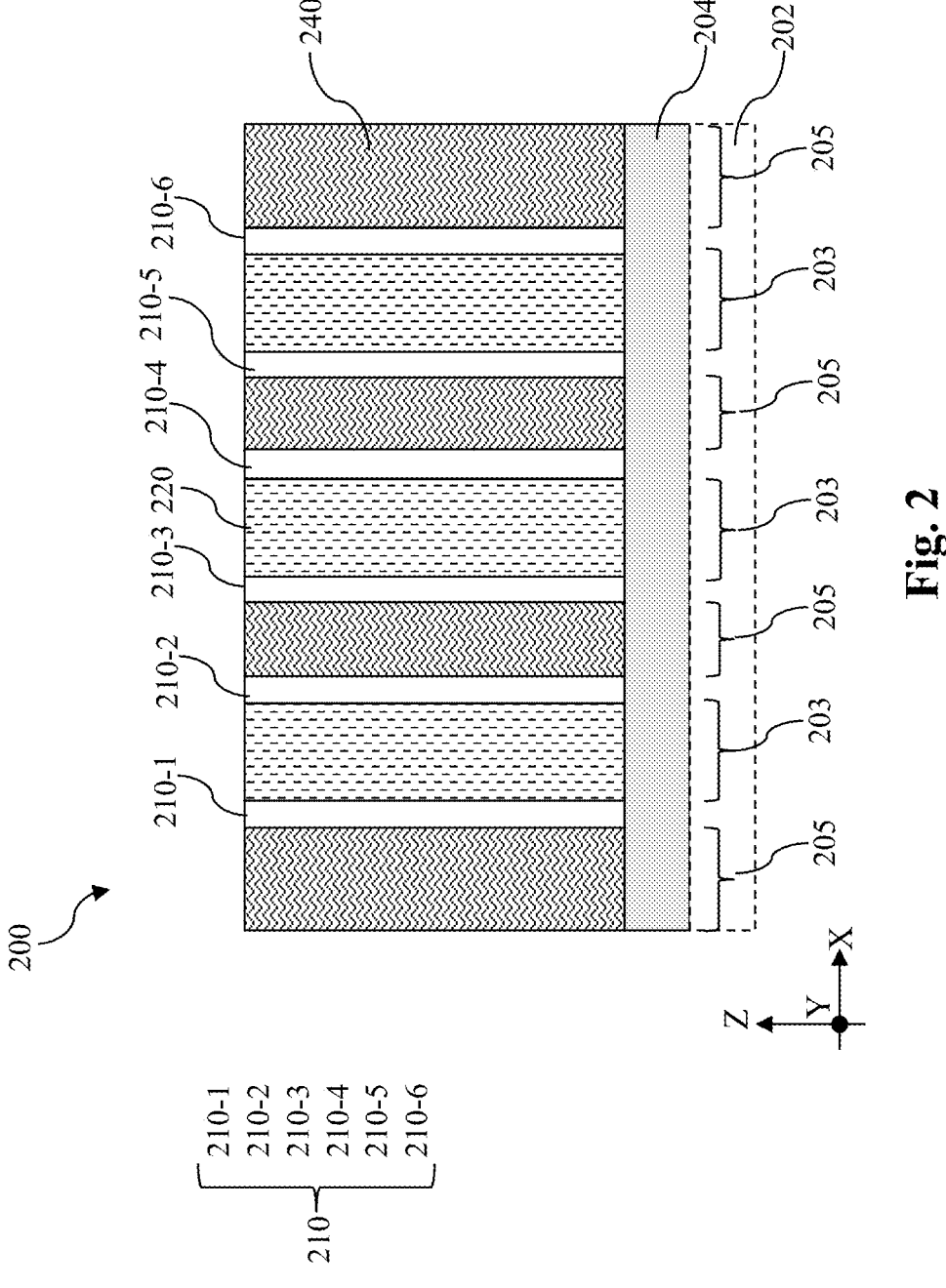

Referring to FIGS. 1 and 2, method 100 includes a block 102 where a workpiece 200 is received. As shown in FIG. 2, the workpiece 200 includes gate structures 220 disposed in a first dielectric layer 240 and a spacer 210 disposed between the gate structure 220 and the first dielectric layer 240. In some embodiments, each of the gate structures 220 may be a gate structure for a FinFET or a GAA transistor that includes an active region 204 over a substrate 202. In these embodiments, the active region 204 may be a semiconductor fin of a FinFET or a topmost nanostructure (i.e., a nanowire, a nanosheet, or a channel member) of a stack of nanostructures of a GAA transistor.

The substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, in some embodiments, the substrate 202 may include an epitaxial layer (epi-layer), the substrate 202 may be strained for performance enhancement, the substrate 202 may include a silicon-on-insulator (SOI) structure, and/or the substrate 202 may have other suitable enhancement features. For ease of illustration, substrate 202 is omitted from FIGS. 3-13, 14A, 14B, 15B, 17-31, 32A, 32B, 33A, and 33B.

The active region 204 may include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. As shown in FIG. 2, the active region 204 extend lengthwise along the X direction. The active region 204 may be fabricated using suitable processes including photolithography and etch processes. The photolithography process may include forming a photoresist layer overlying the substrate 202, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The masking element may then be used to protect regions of the substrate 202 while an etch process forms recesses into the substrate 202, thereby forming the active region 204. The recesses may be etched using a dry etch (e.g., chemical oxide removal), a wet etch, and/or other suitable processes. Numerous other embodiments of methods to form the active region 204 on the substrate 202 may also be used. In embodiments where the active region 204 is a nanostructure of a GAA transistor, first semiconductor layers and second semiconductors layer are first alternatingly and epitaxially grown on the substrate 202 to form a layer stack. The first semiconductor layer and the second semiconductor layer have different compositions. For example, the first semiconductor layer may include silicon and the second semiconductor layer may include silicon and germanium. The semiconductor layer stack having first semiconductor nanostructures and second semiconductor nanostructures is then patterned to form fin-shape stacks of nanostructures. The second semiconductor layers in the channel regions of fin-shape stacks are then selectively removed to release the first semiconductor layers into suspended nanostructures.

Gate structures 220 are formed over channel regions 203 of the active region 204. As illustrated in FIG. 2, the gate structures 220 extend lengthwise along Y direction, which is perpendicular to the X direction, along which the gate structures 220 extend. While not shown in FIG. 2, each of the gate structures 220 includes an interfacial layer, a gate dielectric layer, one or more work function layers, and a metal fill layer. The active region 204 also includes source/drain regions 205 adjacent the channel regions 203. In some embodiments, the interfacial layer may include a dielectric material such as silicon oxide layer or silicon oxynitride. The gate dielectric layer is formed of a high-k (dielectric constant greater than about 3.9) dielectric material that may include $HfO_2$, $TiO_2$, HfZrO, $Ta_2O_3$, $HfSiO_4$, $ZrO_2$, $ZrSiO_2$, combinations thereof, or other suitable materials. The one or more work function layers may include n-type work function layers and p-type work function layers. Example n-type work function layers may be formed of aluminum, titanium aluminide, titanium aluminum carbide, tantalum silicon carbide, tantalum silicon aluminum, tantalum silicon carbide, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten, ruthenium, cobalt or copper. Because the gate dielectric layer is formed of high-k dielectric material and the use of metal in gate structures 220, gate structures 220 may also be referred to high-k metal gate structures 220 or metal gate structures 220.

Each of the active regions 204 also include source/drain regions 205 where epitaxial source/drain features (not explicitly shown in FIG. 2) are formed in, on, adjacent and/or surrounding the active regions 204. As shown in FIG. 2, each of the channel regions 203 is sandwiched between two adjacent source/drain regions 205. The source/drain features may be epitaxially grown over the active region 204 in the source/drain regions 205. Each of the channel regions 203 underlies the gate structure 220. Depending on the device types and design requirements, the epitaxial source/drain features may be doped with n-type dopants or p-type dopants.

The first dielectric layer 240 may be an interlayer dielectric (ILD) layer. The first dielectric layer 240 may be a silicon oxide or silicon oxide containing material where silicon exists in various suitable forms. As an example, the ILD layer includes silicon oxide or a low-k dielectric material whose k-value (dielectric constant) is smaller than that of silicon oxide, which is about 3.9. In some embodiments, the low-k dielectric material includes a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof.

In some embodiments, the spacer 210 may be a single layer or a multi-layer. Example materials for the spacer 210 include silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. The material for the spacer 210 is selected such that the spacer 210 and the first dielectric layer 240 have different etching selectivity. That is, the selection of materials allows each of the spacer 210 or the first dielectric layer 240 to be selectively etched without substantially damaging the other. In one example, the spacer 210 is formed of silicon oxycarbonitride. The spacer 210 includes a thickness between about 1 nm and about 15 nm along the X direction.

Figure 3:
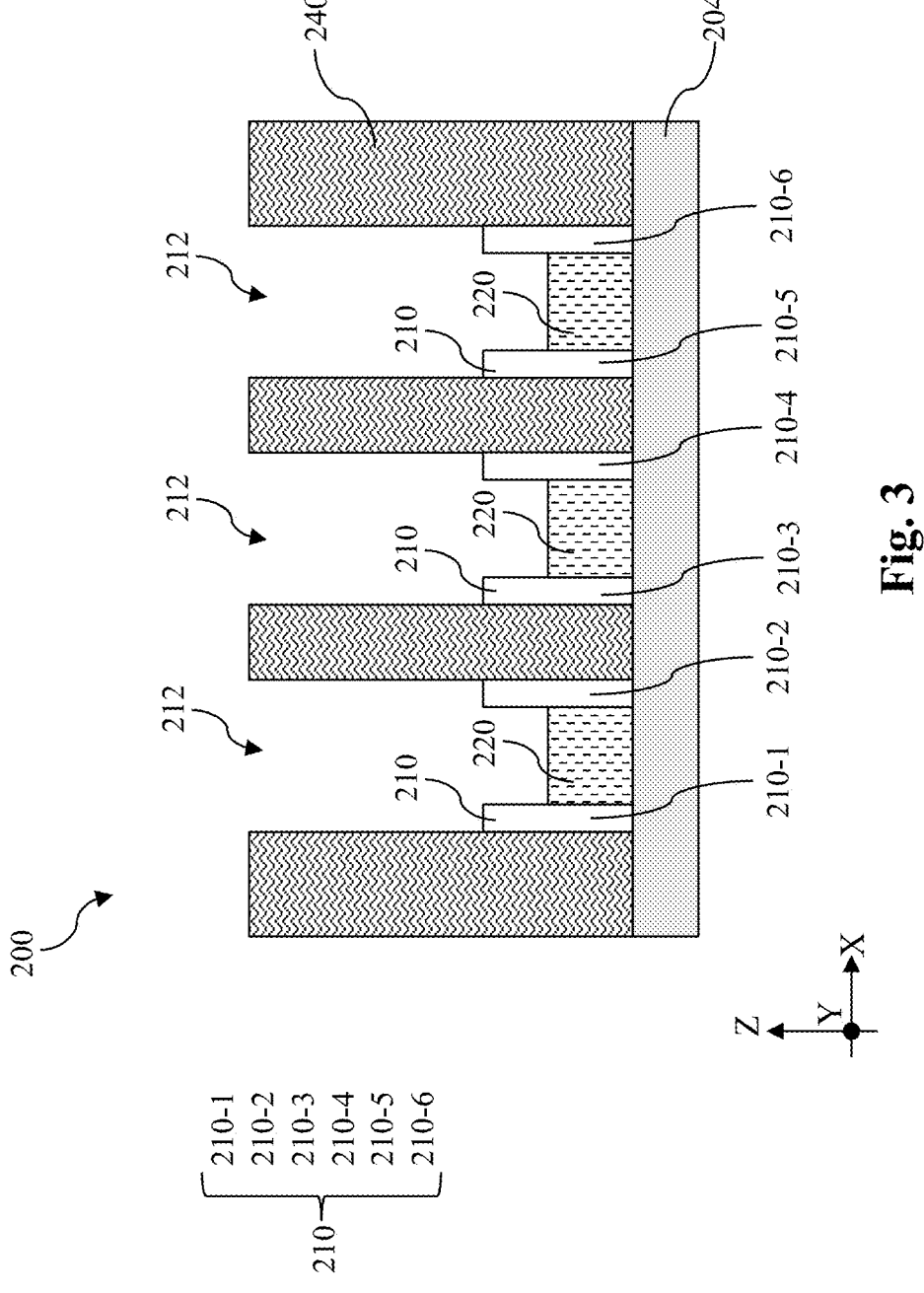

Referring to FIGS. 1 and 3, method 100 includes a block 104 where the gate structure 220 and the spacer 210 are selectively etched to form a first contact recess 212. In some embodiments, block 104 includes an etch process that selectively etches the gate structure 220 and the spacer 210 without substantially etching the first dielectric layer 240. The etch process at block 104 may include a dry etch, a wet dry, a combination thereof, or other suitable etch process. In some implementations illustrated in FIG. 3, the etching process at block 104 includes at least one component that etches the gate structure 220 at a greater than rate than it etches the spacer 210 such that the a top surface of the gate structure 220 is lower than a top surface of the spacer 210, measured from a top surface of the active region 204 along the Z direction. Put differently, the first contact recess 212 includes a space directly between two spacer features of the spacer 210 (such as between first spacer feature 210-1 and second spacer feature 210-2, between third spacer feature 210-3 and fourth spacer feature 210-4, and between fifth spacer feature 210-5 and sixth spacer feature 210-6). The first contact recess 212 exposes sidewalls of the first dielectric layer 240, top surfaces of the spacer 210, sidewalls of the spacer 210 and a top surface of the gate structure 220. For ease of reference, the metal fill layer and the one or more work function layers may be collectively referred to as the gate electrode of the gate structure 220. Operations at block 104 selectively etch the gate electrode of the gate structures 220 as well as the spacer 210 while the first dielectric layer 240 is not substantially etched.

Figure 4:
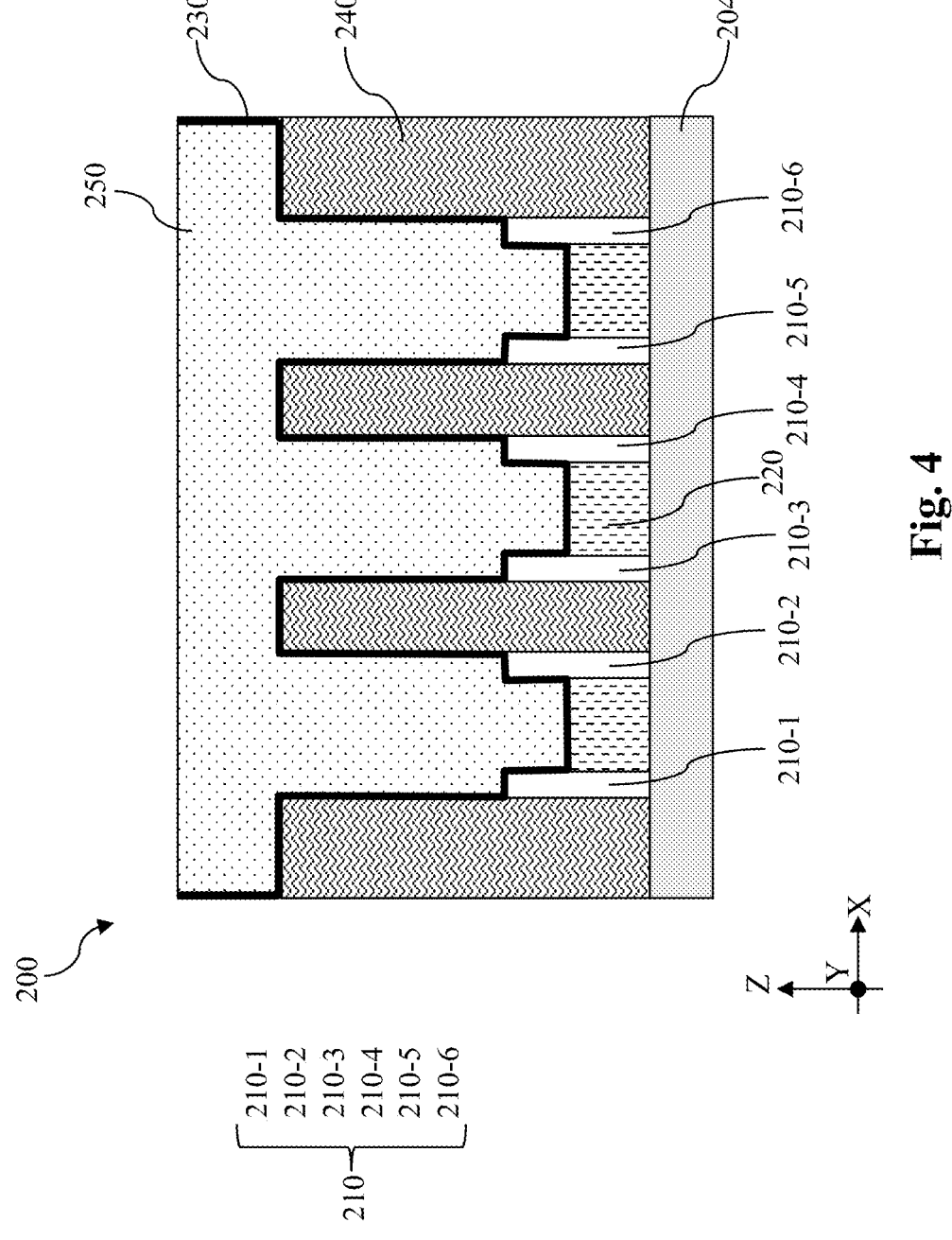

Referring to FIGS. 1 and 4, method 100 includes a block 106 where a liner 230 is deposited over the workpiece 200. In some embodiments, the liner 230 is conformally deposited over the workpiece 200, including over and along surfaces exposed in the first contact recess 212. As shown in FIG. 4, such exposed surfaces include sidewalls of the first dielectric layer 240, top surfaces of the spacer 210, sidewalls of the spacer 210 and a top surface of the gate structure 220. In these embodiments, the liner 230 may be deposited using atomic layer deposition (ALD) or a suitable deposition process. The liner 230 may be formed of silicon oxide, hafnium silicide, silicon oxycarbide, aluminum oxide, zirconium silicide, aluminum oxynitride, zirconium oxide, hafnium oxide, hafnium zirconium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. In one embodiment, the liner 230 is formed of hafnium zirconium oxide. As will be described further below, the liner 230 serves to protect the spacer 210 from being damaged during etching of a first self-aligned contact (SAC) dielectric material 250 (shown in FIG. 5). The liner 230 may have a thickness between about 1 nm and about 10 nm. On the one hand, when the thickness of the liner 230 is below 1 nm, the liner 230 may not provide sufficient protection to the spacer 210. One the other hand, when the thickness of the liner 230 is more than 10 nm, the insulative liner 230 would displace volume of conductive gate contact, resulting in increased resistance.

Referring still to FIGS. 1 and 4, method 100 includes a block 108 where a first SAC dielectric material 250 is deposited over the liner 230. In some embodiments, the first SAC dielectric material 250 may be deposited over the liner 230 using a deposition technique that has good hole-filling capability. For example, the first SAC dielectric material 250 may be deposited using high-density-plasma CVD (HDPCVD), plasma enhanced CVD (PECVD), atomic layer deposition (ALD), or a suitable deposition process. The first SAC dielectric material 250 may be formed of silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. In one embodiment, the first SAC dielectric material 250 is formed of zirconium oxide. In some embodiments, the first SAC dielectric material 250 may be referred to as a capping layer 250. The first SAC dielectric material 250 and the liner 230 have different compositions such that the first SAC dielectric material 250 may be selectively etched without substantially etching the liner 230.

Figure 5:
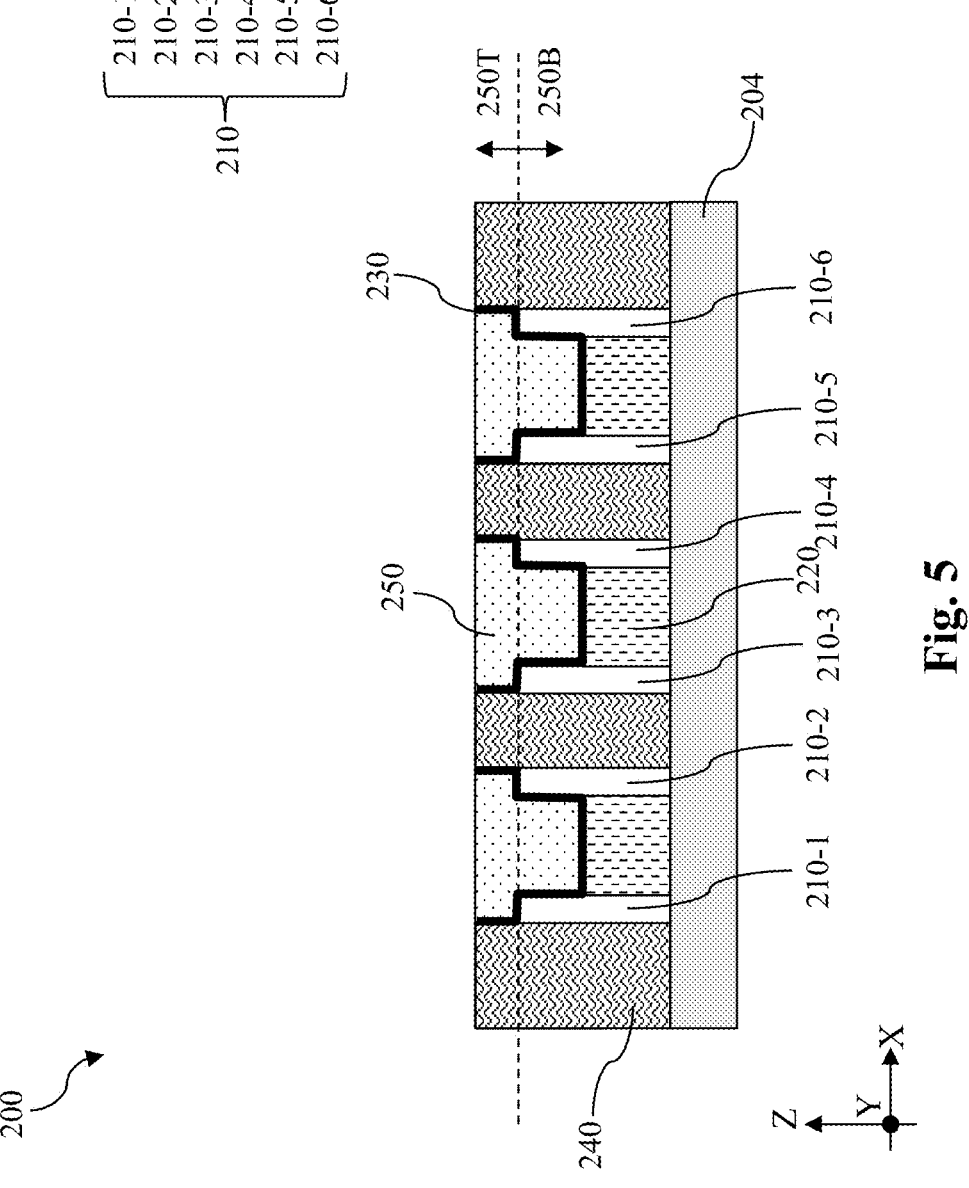

The block 108 may include a planarization process to provide the workpiece 200 with a planar top surface for subsequent processes. As shown in FIG. 5, the planarization process may be a chemical mechanical polishing (CMP) process. In some embodiments, after the planarization process, the first SAC dielectric material 250 may include a bottom portion 250B and a top portion 250T over the bottom portion 250B. The bottom portion 250B is defined vertically (along the Z direction) between the top surface of the gate structure 220 and a bottom surface of the top portion 250T; and horizontally (along the X direction) between the spacer features (such as between first spacer feature 210-1 and second spacer feature 210-2, between third spacer feature 210-3 and fourth spacer feature 210-4, and between fifth spacer feature 210-5 and sixth spacer feature 210-6). The top portion 250T is defined as the portion of the first SAC dielectric material 250 that is disposed over the bottom portion 250B. As shown in FIG. 5, the top portion 250T, if present, is also disposed over the spacer features (such as over the first spacer feature 210-1 and second spacer feature 210-2, over the third spacer feature 210-3 and fourth spacer feature 210-4, and over the fifth spacer feature 210-5 and sixth spacer feature 210-6). In some implementations, the bottom portion 250B and the top portion 250T of the first SAC dielectric material 250 have different compositions. In those implementations, the bottom portion 250B has an etching selectivity similar to that of the liner 230 while the top portion 250T has an etching selectivity different from that of the liner 230. When forming a gate contact opening (described below at block 120) using an etching process, the different etching selectivity between the top portion 250T and the liner 230 allows selective etching through the top portion 250T without substantially etching the liner 230. As the etching process continues, the similar etching selectivity between the bottom portion 250B and the liner 230 allows simultaneous removal of the bottom portion 250B and the liner 230 around the bottom portion 250B. This arrangement has at least two benefits. First, it may be implemented when the liner 230 is formed of high-k dielectric material and presence of such high-k liner 230 in the first contact recess 212 may increase parasitic capacitance. Second, it may remove electrically insulative liner 230 and make more room for conductive materials that forms the gate contact. In one embodiments, the bottom portion 250B is formed of hafnium oxide and the top portion 250T is formed of zirconium oxide. In some other embodiments, the bottom portion 250B and the top portion 250T have the same composition. In some instances, the top portion 250T has a thickness between about 0 nm and about 50 nm along the Z direction. For avoidance of doubts, when the top portion 250T has a thickness of 0 nm, there is no top portion 250T. When the top portion 250T has a thickness greater than 50 nm, it may unduly increase an aspect ratio of a gate contact opening (to be described below in conjunction with FIGS. 14A and 14B) to a point where yield may be compromised.

Figure 6:
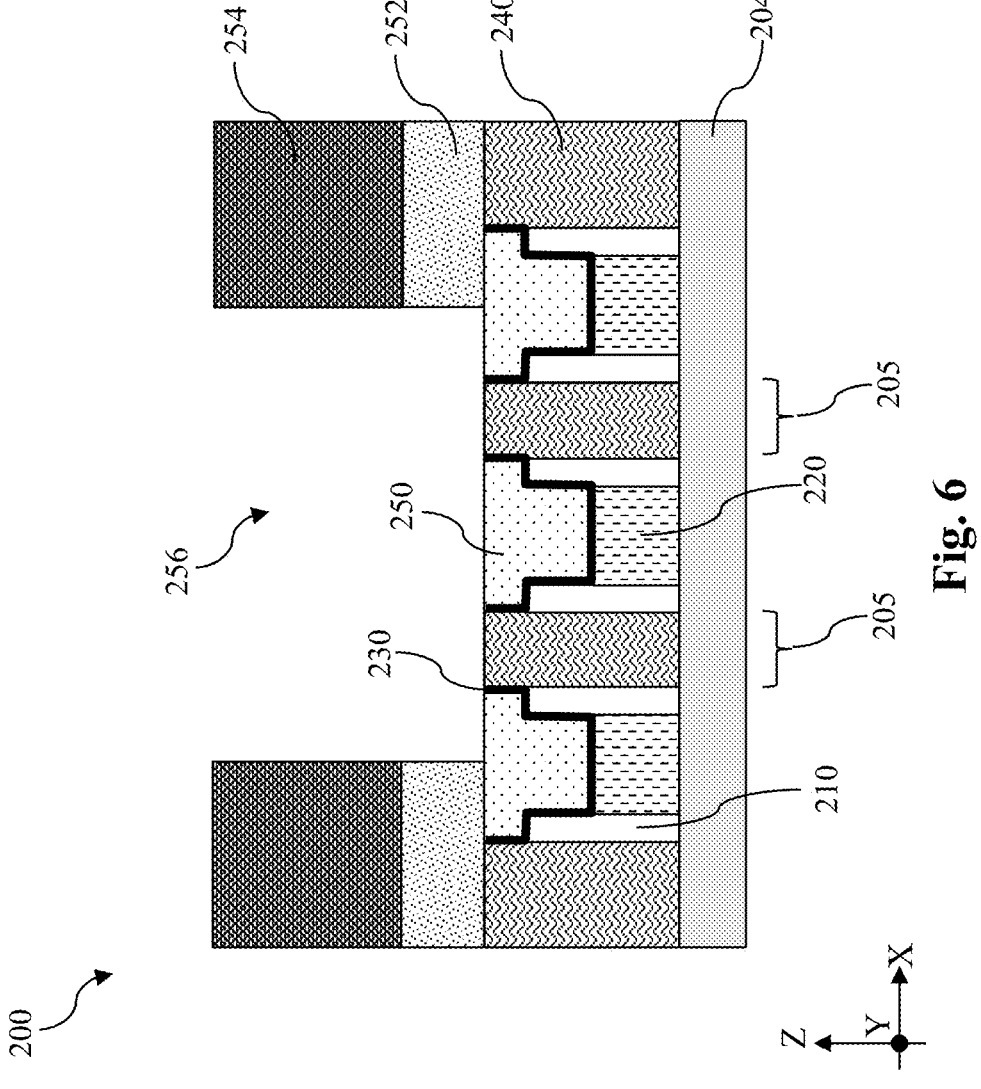
Figure 8:
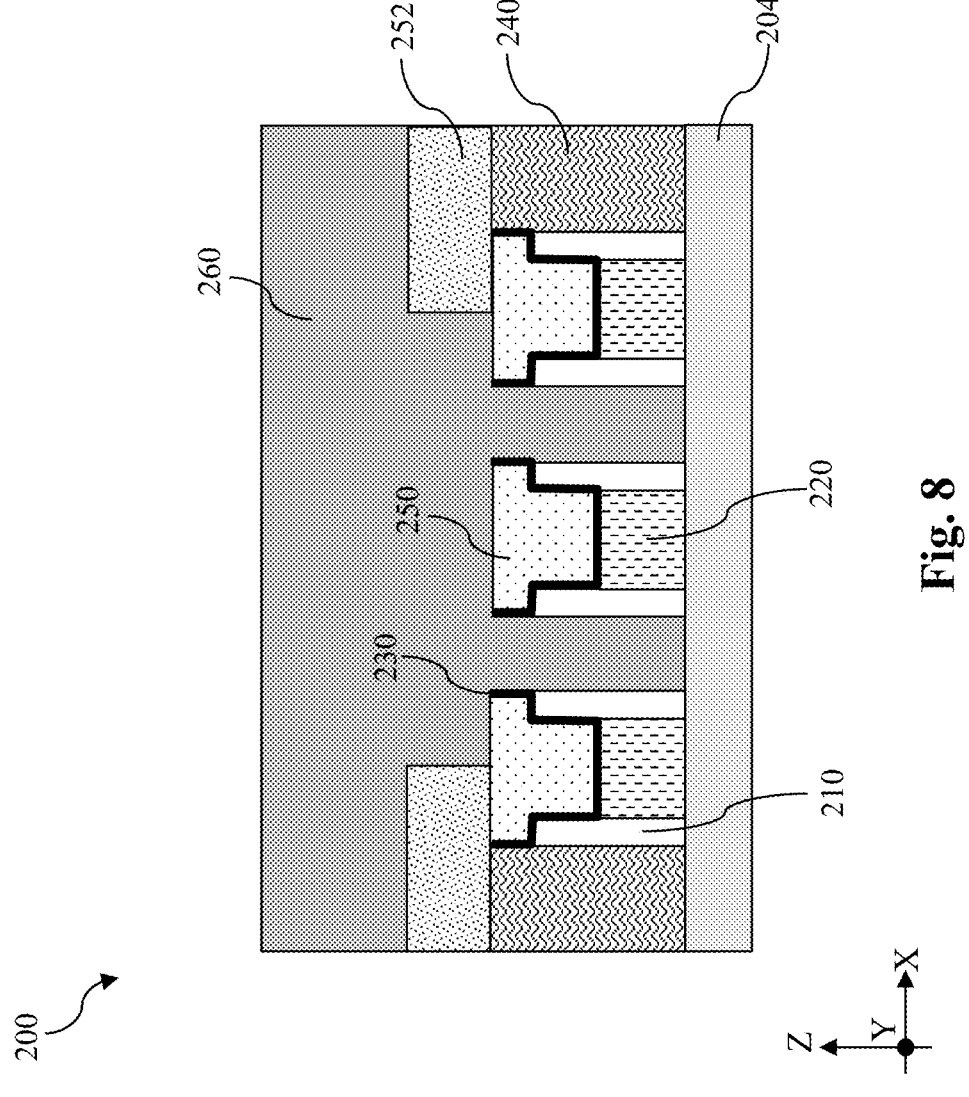

Referring to FIGS. 1, 6, 7, 8, and 9, method 100 includes a block 110 where a source/drain contact 260 adjacent the spacer 210 is formed. Operations at block 110 include formation of a patterned first hard mask layer 252 shown in FIG. 6, formation of source/drain contact opening 258 shown in FIG. 7, formation of the source/drain contact 260 in the source/drain contact opening 258 shown in FIG. 8, and planarization shown in FIG. 9. Reference is first made to FIG. 6. A first hard mask layer 252 is first formed over the workpiece 200 by CVD or a suitable method. The first hard mask layer 252 may be formed of silicon oxide, silicon nitride, or other suitable dielectric material. The first hard mask layer 252 may be a single layer or a multi-layer. For example, the first hard mask layer 252 may include a silicon oxide layer and a silicon nitride layer disposed over the silicon oxide layer. Subsequently, a photoresist layer 254 is deposited over the first hard mask layer 252 using spin-on coating or a suitable method. The photoresist layer 254 may be a single layer or a multi-layer. For example, the photoresist layer 254 may be a tri-layer having three layers. The photoresist layer 254 is patterned using photolithography process to form a patterned photoresist layer 254. The first hard mask layer 252 is then etched using the patterned photoresist layer 254 as an etch mask to form a patterned first hard mask layer 252. The patterned first hard mask layer 252 includes an opening 256 that spans over at least one source/drain region 205.

Figure 9:
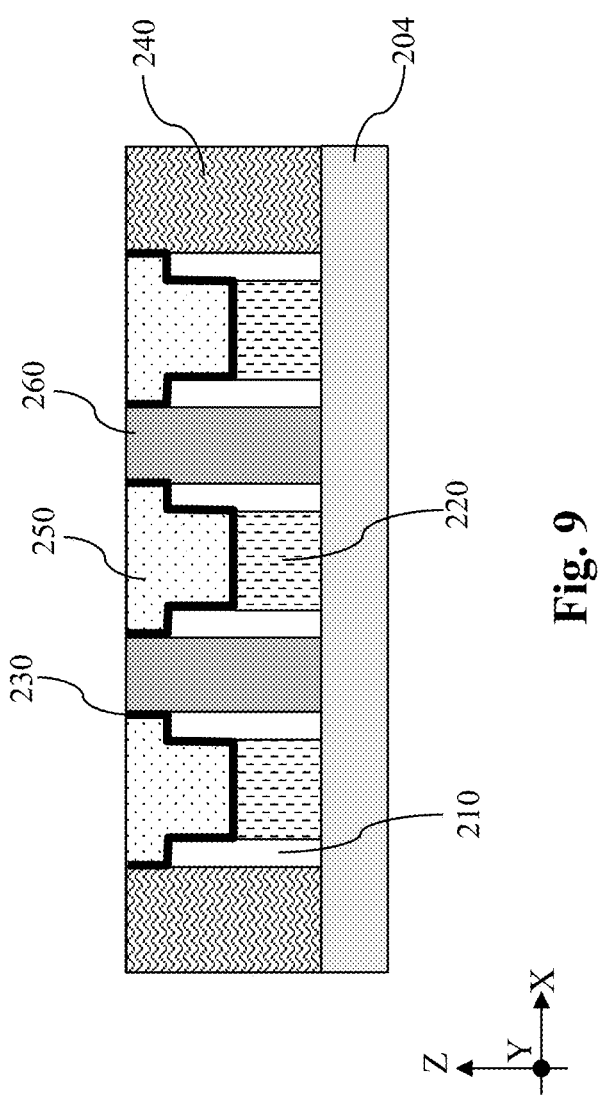

Referring now to FIG. 7, the workpiece 200 is then etched using the patterned first hard mask layer 252 as an etch mask. As shown in FIG. 7, the workpiece 200 is etched using an etch process that selectively removes the first dielectric layer 240 exposed in the opening 256, so as to form source/drain contact openings 258 over the source/drain regions 205. The source/drain contact openings 258 expose top surfaces of source/drain features in, on, or over the active region 204. The formation of source/drain contacts 260 is representatively illustrated in FIGS. 8 and 9. To electrically couple the source/drain contacts 260 to the source/drain regions 205, a silicide layer (not shown in FIGS. 8 and 9) may be formed on the source/drain features in the source/drain regions 205. For example, a silicide precursor, such as nickel, cobalt and titanium, is deposited over the source/drain features in the source/drain regions 205. The workpiece 200 is then annealed to bring about silicidation reaction between silicon in the source/drain features and the silicide precursor. The silicidation reaction results in a silicide feature, such as nickel silicide, cobalt silicide or titanium silicide. The silicide feature may reduce the contact resistance between the source/drain features in the source/drain regions 205 and the source/drain contacts 260. Thereafter, a conductive material for source/drain contacts 260, such as tungsten, ruthenium, cobalt, copper, titanium, titanium nitride, tantalum, tantalum nitride, molybdenum, or nickel, may be deposited over the workpiece 200, including within the source/drain contact openings 258. Referring now to FIG. 9, the workpiece 200 is then planarized using a suitable planarization technique, such as CMP to provide a planar top surface.

Figure 10:
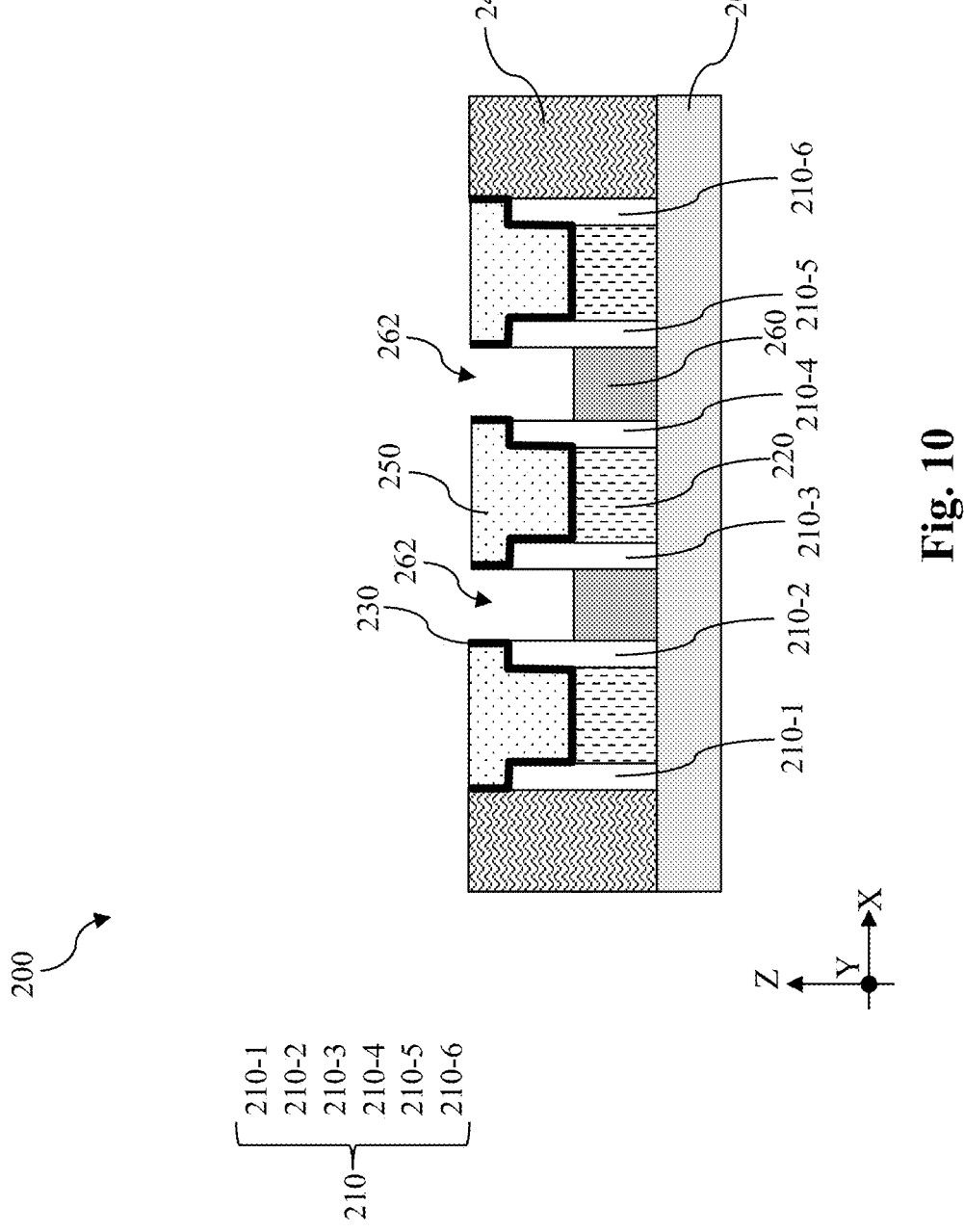

Referring to FIGS. 1 and 10, method 100 includes a block 112 where the source/drain contact 260 is selectively pulled back to form a second contact recess 262. In some embodiments, the source/drain contact 260 is selectively pulled back to make room for the second SAC dielectric material 270 to be deposited in block 114 below. In some implementations, the pull-back process at block 112 is selected such that it selectively etches the source/drain contact 260 without substantially etching the first dielectric layer 240, the liner 230, the spacer 210, and the first SAC dielectric material 250. As shown in FIG. 10, each of the second contact recesses 262 is defined by a top surface of the source/drain contact 260, sidewalls of the spacer 210, and sidewalls of the liner 230. Put differently, a lower portion of the second contact recess 262 is defined between two spacer features (such as between first spacer feature 210-1 and second spacer feature 210-2, between third spacer feature 210-3 and fourth spacer feature 210-4, and between fifth spacer feature 210-5 and sixth spacer feature 210-6) and an upper portion of the second contact recess 262 is disposed between two segments of the liner 230. After operations at block 112, the pulled-back source/drain contact 260 may have a thickness between about 1 nm and about 50 nm.

Figure 11:
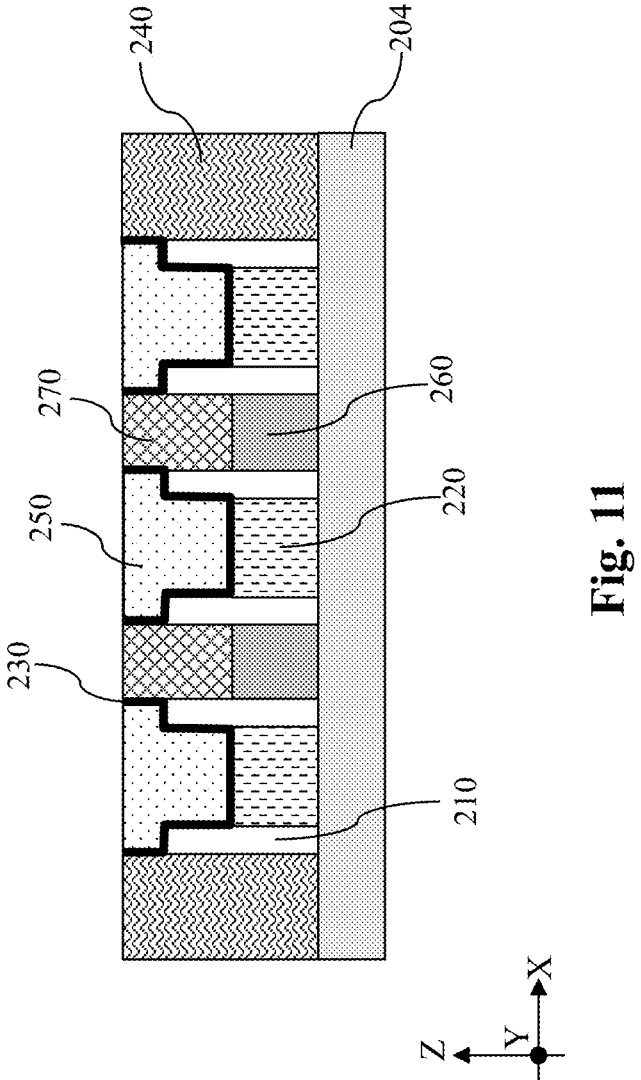

Referring to FIGS. 1 and 11, method 100 includes a block 114 where a second SAC dielectric material 270 is deposited in the second contact recess 262. In some embodiments, the second SAC dielectric material 270 may be deposited over the liner 230 using a deposition technique that has good hole-filling capability. For example, the second SAC dielectric material 270 may be deposited using HDPCVD, PECVD, ALD, or a suitable deposition process. The second SAC dielectric material 270 may be formed of silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. The second SAC dielectric material 270 is selected such that it has different etching selectivity from the first SAC dielectric material 250. After the deposition of the second SAC dielectric material 270, the workpiece 200 is planarized by a suitable planarization technique, such as CMP, to provide a planar top surface.

Figure 12:
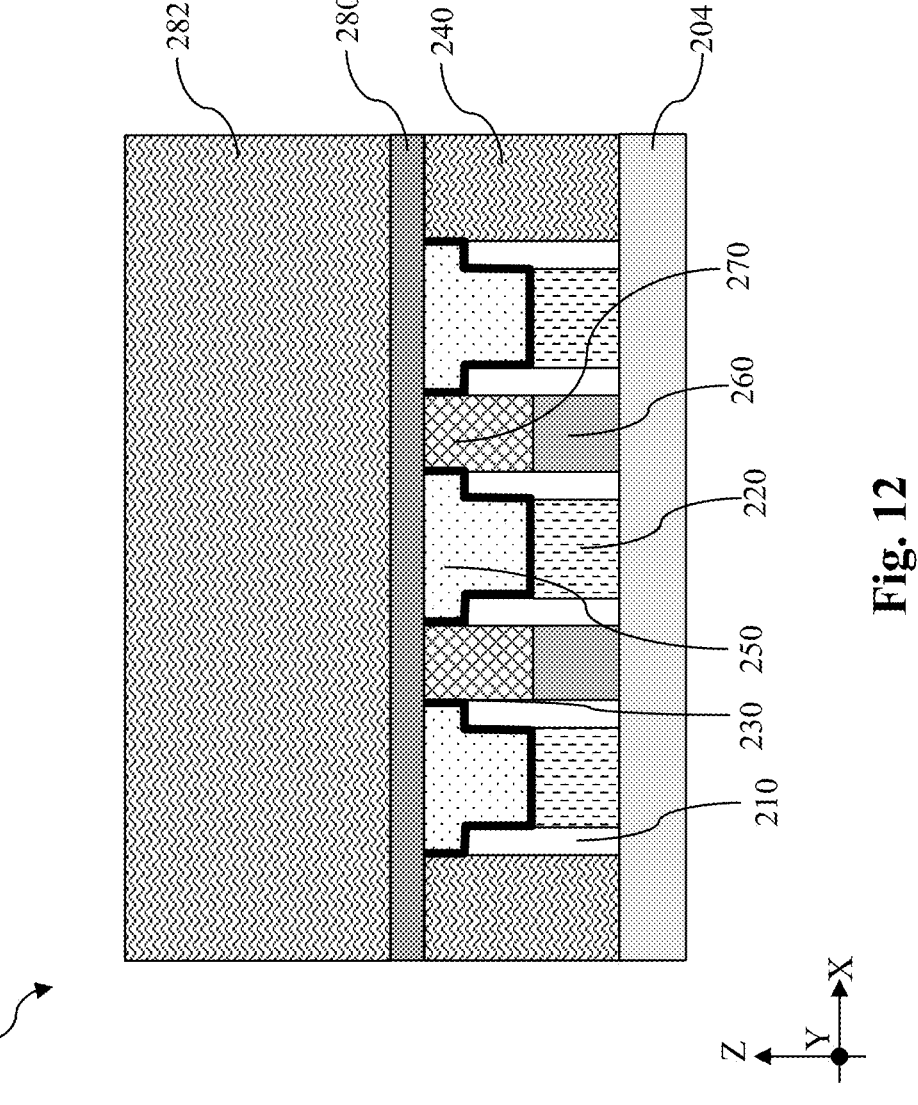

Referring to FIGS. 1 and 12, method 100 includes a block 116 where a contact etch stop layer (CESL) 280 is deposited over the workpiece 200. The CESL 280 may be formed of silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. In some implementations, the CESL 280 may be deposited using CVD, ALD, or a suitable deposition method. In one embodiment, the CESL 280 is formed of silicon nitride and has a thickness between about 1 nm and about 30 nm.

Referring to FIGS. 1 and 12, method 100 includes a block 118 where a second dielectric layer 282 is deposited over the CESL 280. In some embodiments, the composition and deposition method of the second dielectric layer 282 may be substantially identical to those of the first dielectric layer 240. Details regarding the formation and material of the second dielectric layer 282 are omitted for brevity.

Figure 13:
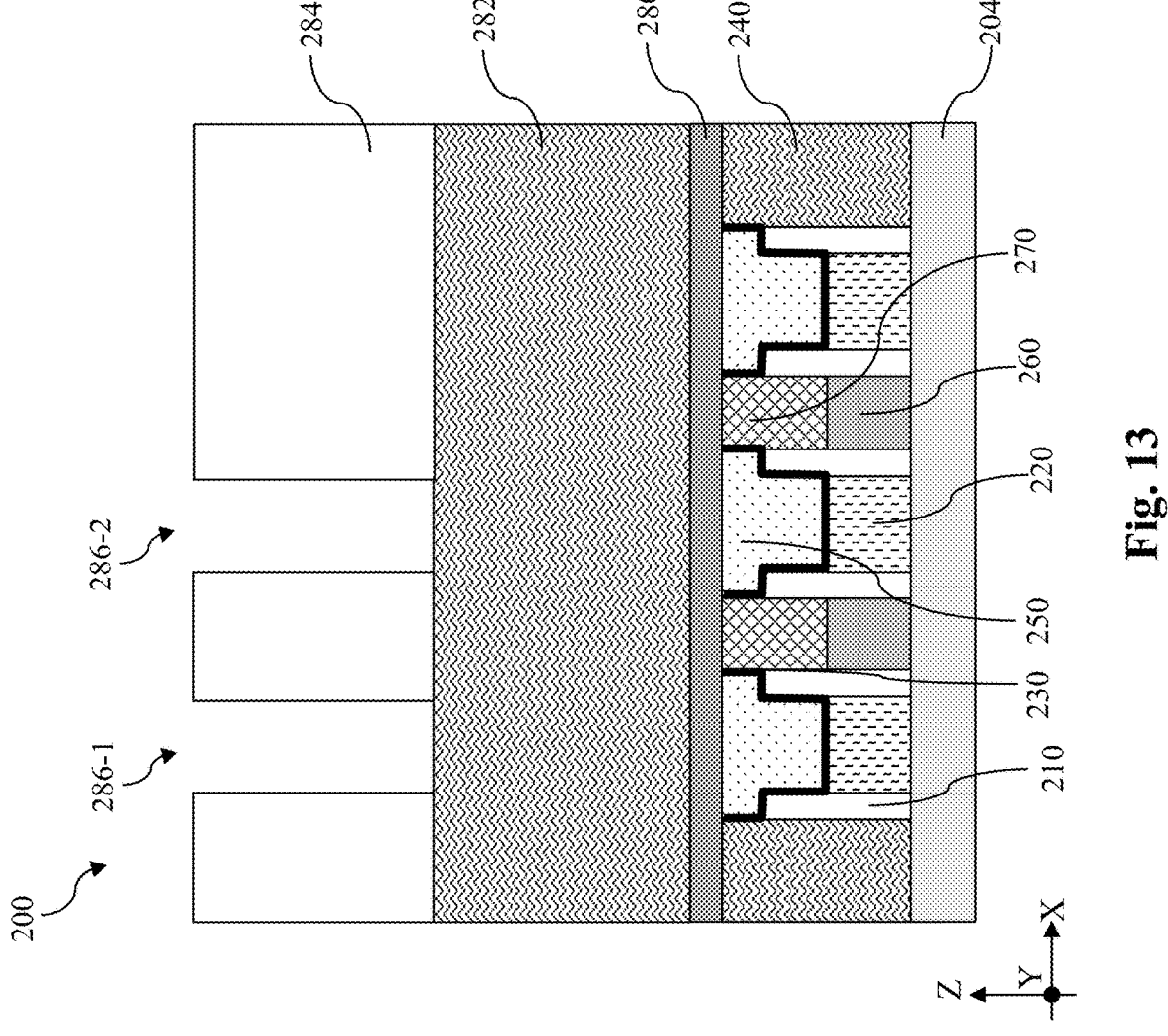
Figure 14A:
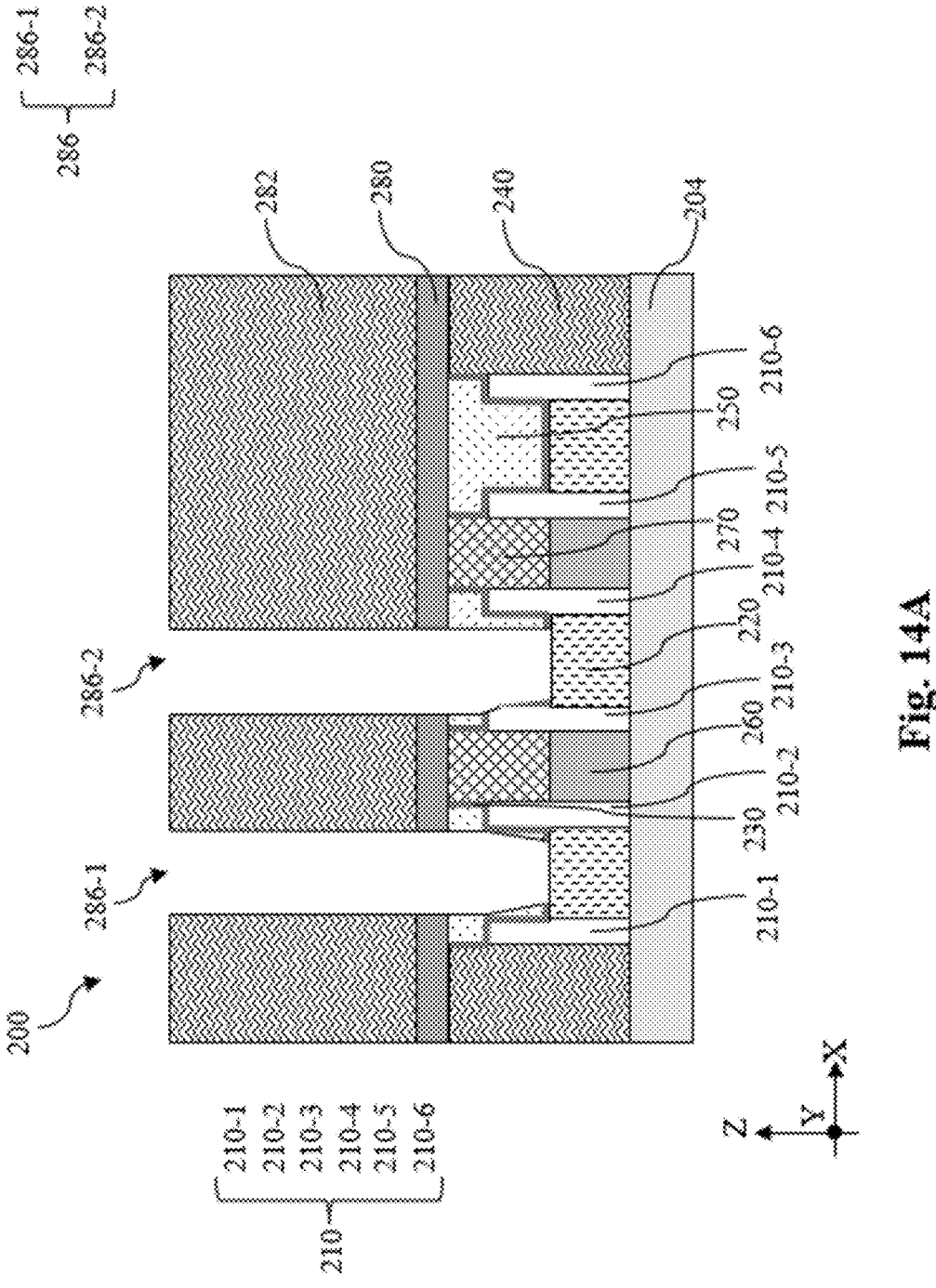

Referring to FIGS. 1, 13, 14A, method 100 includes a block 120 where gate contact openings 286 are formed to expose the gate structure 220. A combination of photolithography processes and etching processes may be used to form the gate contact openings 286. In some embodiments illustrated in FIG. 13, a photoresist layer 284 is first deposited over the second dielectric layer 282. The photoresist layer 284 may be substantially similar to photoresist layer 254. Detailed description of the photoresist layer 284 is therefore omitted for brevity. As shown in FIG. 13, the photoresist layer 284 is patterned using photolithography processes. Reference is then made to FIG. 14A. The patterned photoresist layer 284 is used as an etch mask to form the gate contact openings 286 through the second dielectric layer 282, the CESL 280, the first SAC dielectric material 250, and the liner 230, so as to expose top surfaces of the gate structures 220.

In some instances represented in FIG. 14A, the gate contact openings 286 may not always completely align with the gate structures 220. For example, a first gate contact opening 286-1 in FIG. 14A is substantially aligned with the underlying gate structure 220 while a second gate contact opening 286-2 in FIG. 14A overlaps but misaligns with the underlying gate structure 220. Compared to the second gate contact opening 286-2, the first gate contact opening 286-1 is preferable because the spacer features 210-1 and 210-2 are not etched. The misalignment in the second gate contact opening 286-2 causes uneven etching toward the third spacer feature 210-3. Because material of the liner 230 is selected to have different etching selectivity than the first SAC dielectric material 250, the liner 230 of the present disclosure protects the spacer feature 210-3 from being etched. As shown in FIG. 14A, at least a portion of the liner 230 is exposed in the gate contact openings 286. Some of the gate structures 220 may not include a gate contact opening formed thereover. For example, no gate contact opening is formed between the spacers features 210-5 and 210-6 to couple to the underlying gate structure 220. In those instances, the first SAC dielectric material 250 and the liner 230 remain intact.

Figure 14B:
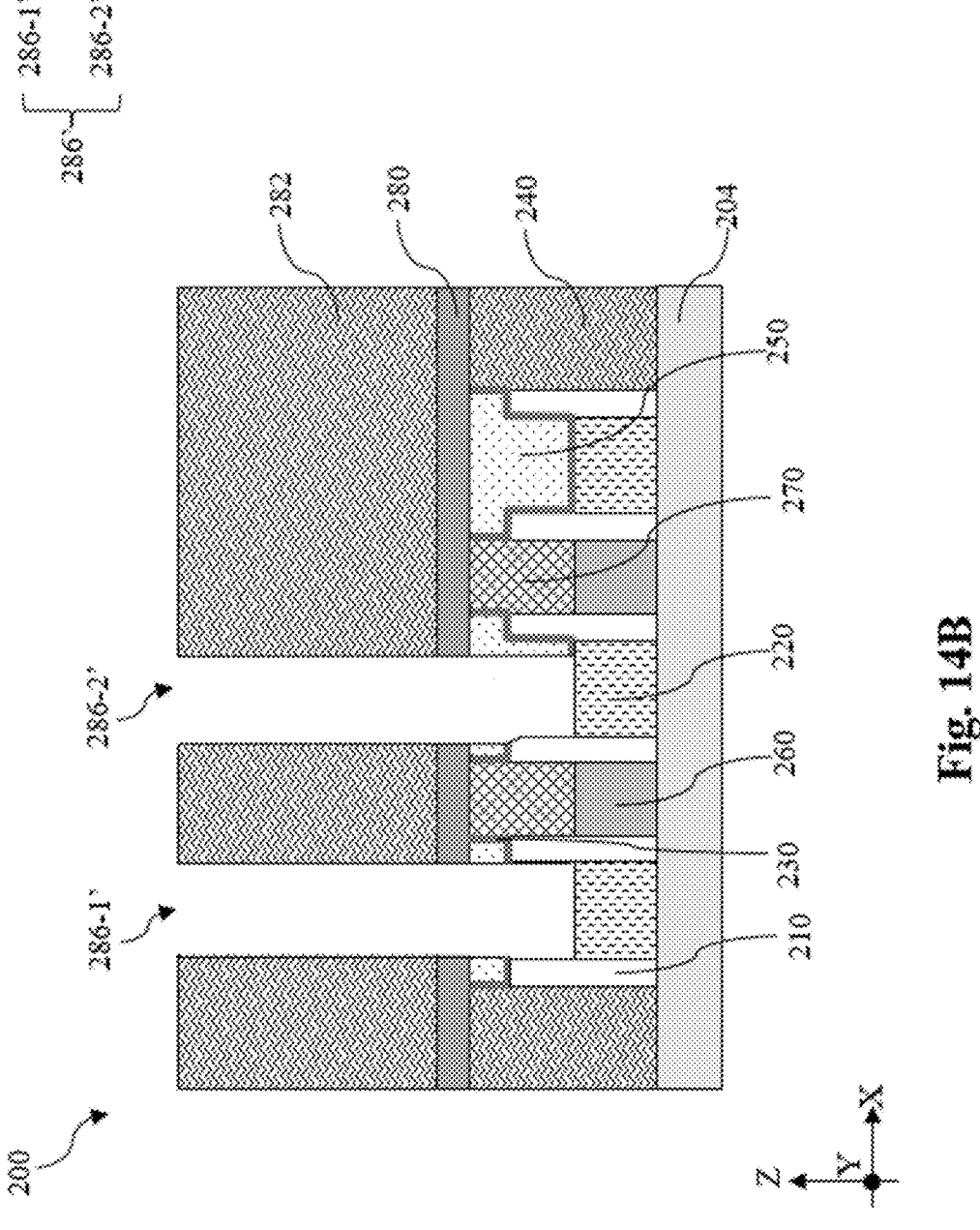
Figure 15A:
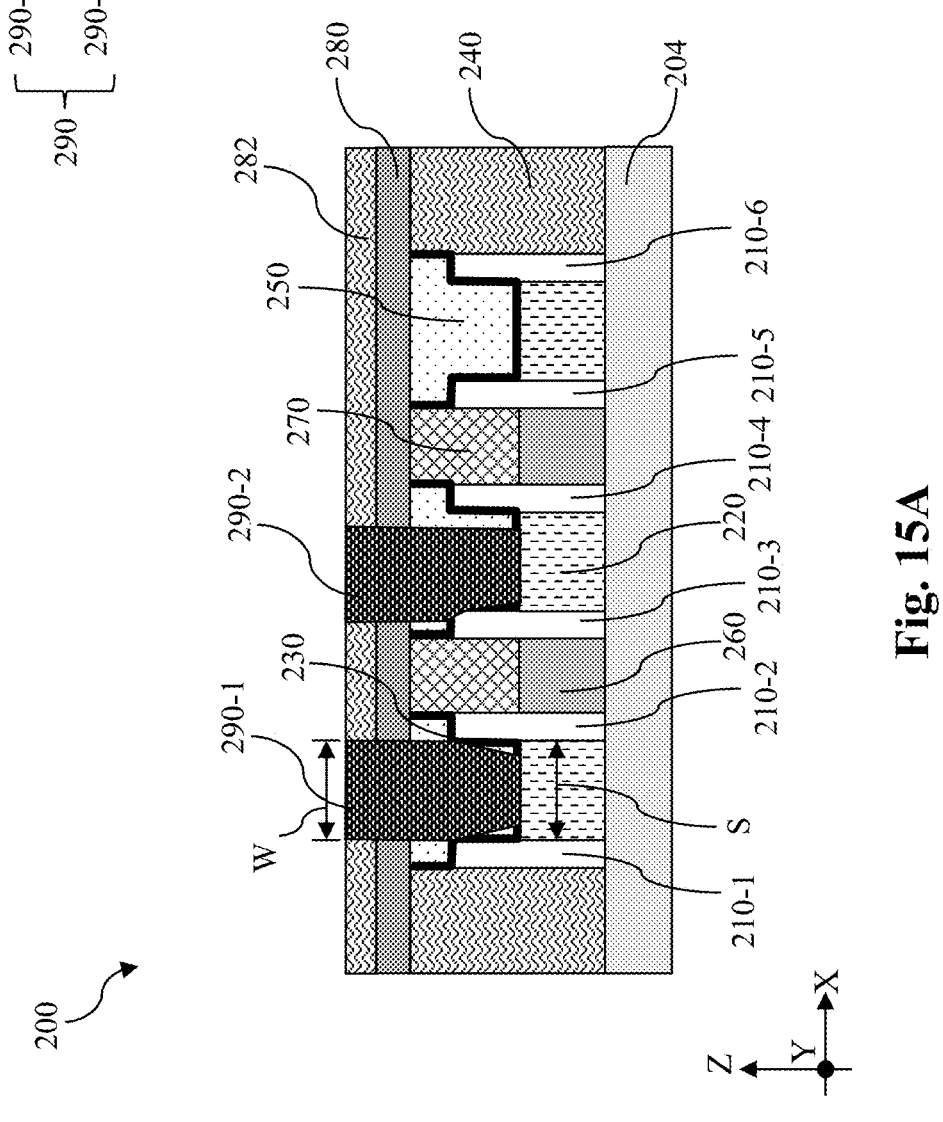
Figure 15B:
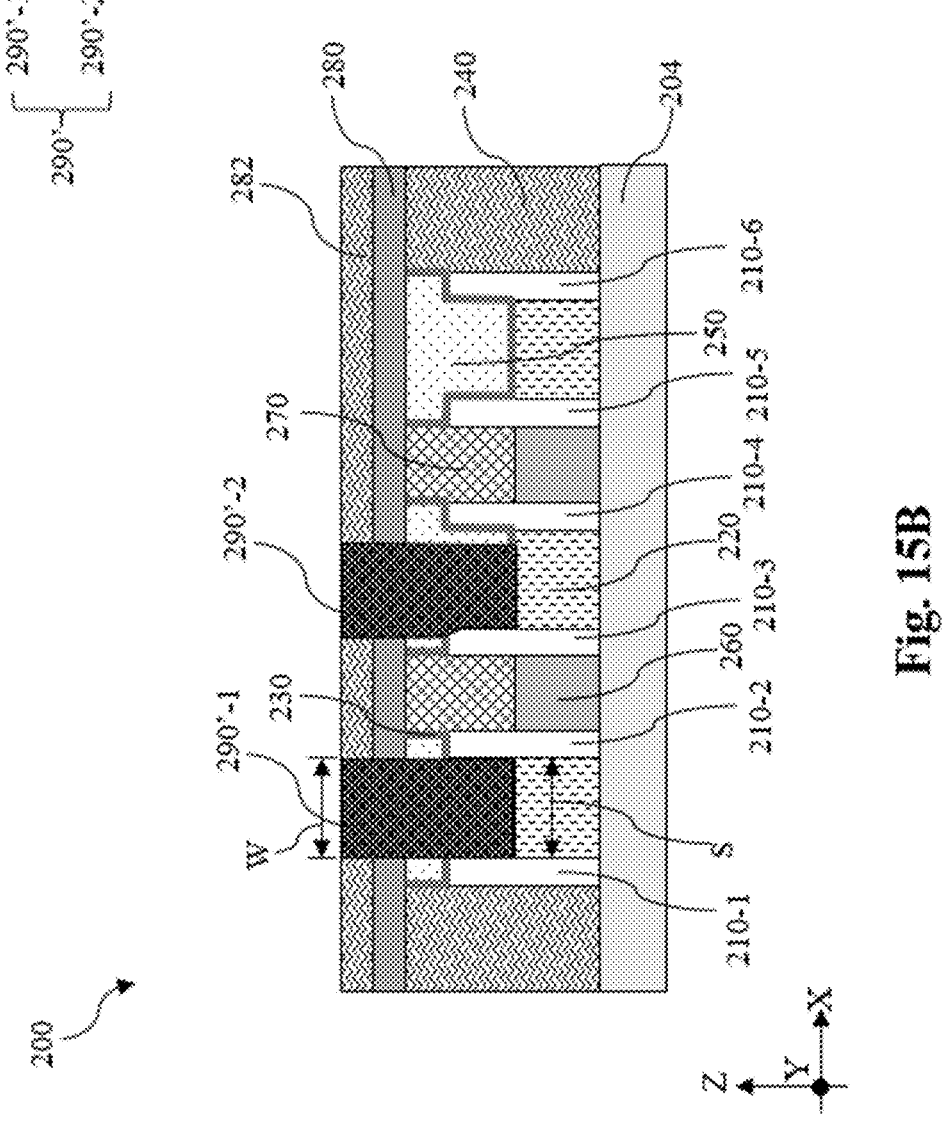
Figure 15C:
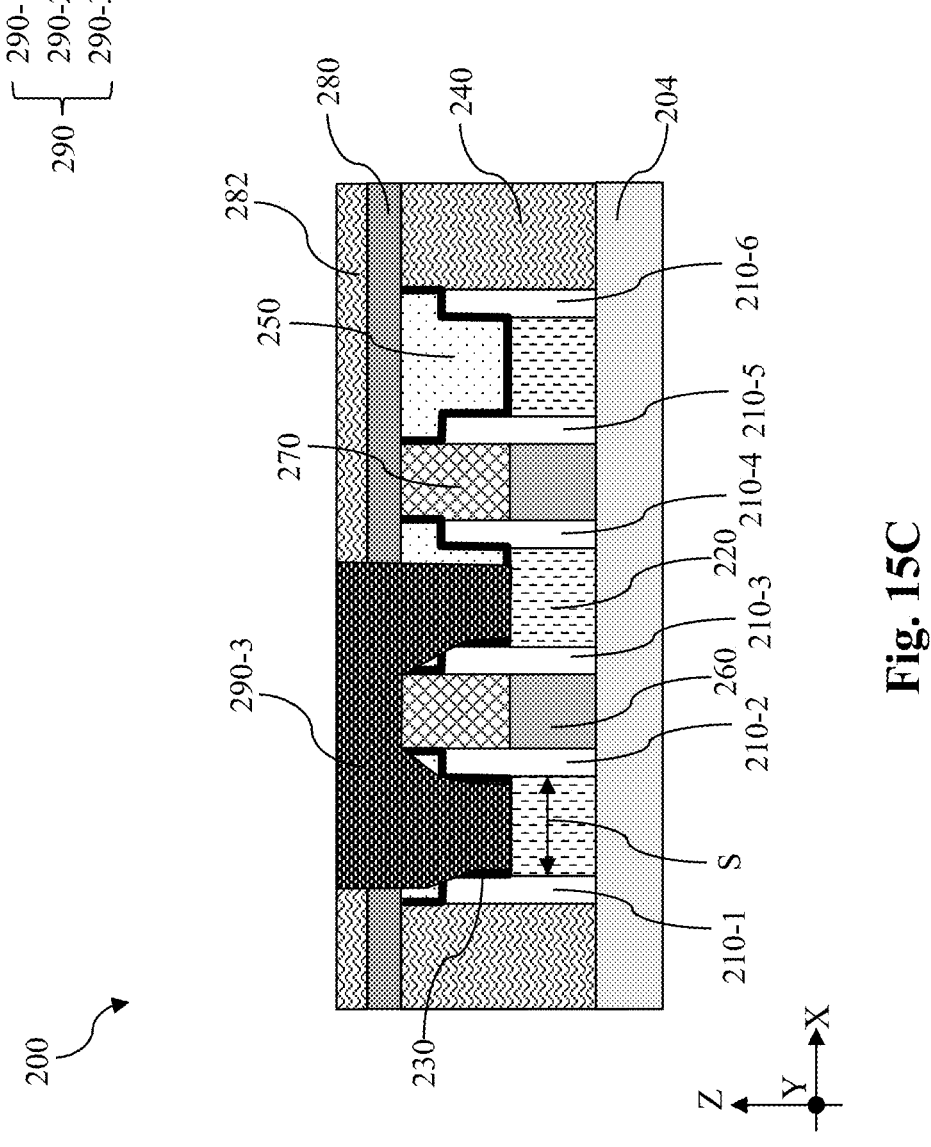
Figure 15D:
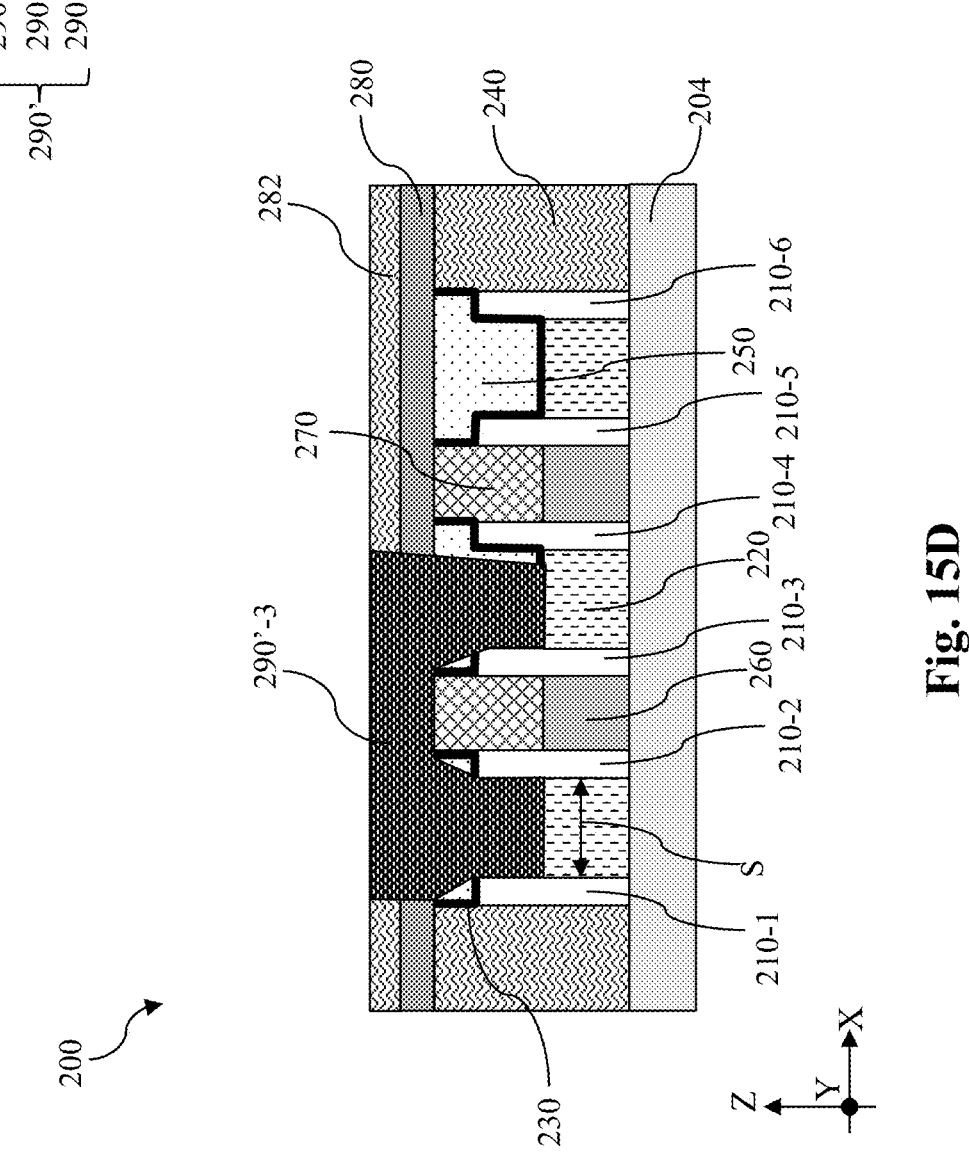

Referring to FIGS. 1 and 14B, method 100 may optionally include a block 122 where the liner 230 in the gate contact openings 286 is trimmed. In some embodiments, a portion of the liner 230 in the gate contact openings 286 may be removed to increase room for gate contact deposition. As shown in FIG. 14B, operations at block 122 not only remove a portion of the liner 230 but also a portion of the first SAC dielectric material 250 in the gate contact openings 286. In some implementations represented in FIG. 14B, sidewalls of the spacer 210 may become exposed in the gate contact openings 286'. As compared to the gate trenches 286 in FIG. 14A, the gate trenches 286' in FIG. 14B are wider along the X direction between spacer features due to removal of the portion of liner 230. Operations at block 122 have several benefits. For example, the removal of a portion of the liner

230 may made more room for gate contact 290 at block 124. For another example, because the liner 230 may be formed of high-k dielectric materials, removal of high-k liner 230 helps reduce parasitic capacitance. In some embodiments represented in FIG. 14A, the gate contact opening 286-2 may not be perfectly aligned with the gate structure 220 and may be partially disposed over the spacer 210. In these embodiments, the gate contact opening 286-2 is asymmetric with respect to the Z direction. Similarly, as shown in FIG. 14B, the gate contact opening 286'-2 may be disposed over the spacer 210 and is asymmetric with respect to the Z direction.

Referring to FIGS. 1 and 15A-15D, method 100 includes a block 124 where a gate contact is formed in the gate contact opening. As used herein, a gate contact 290 illustrated in FIGS. 15A and 15C and refers to types of gate contacts formed in the gate openings 286 shown in FIG. 14A; and a gate contact 290' illustrated in FIGS. 15B and 15D and refers to types of gate contacts formed in the gate openings 286' shown in FIG. 14B. In some embodiments, a conductive material, such as tungsten, ruthenium, cobalt, copper, titanium, titanium nitride, tantalum, tantalum nitride, molybdenum, or nickel, may be deposited over the workpiece 200, including within the gate contact openings 286 in FIG. 14A or 286' in FIG. 14B. The workpiece 200 is then planarized to form gate contacts 290 in FIGS. 15A and 15C and gate contacts 290' in FIGS. 15B and 15D. In some embodiments illustrated in FIGS. 15A and 15B, gate contacts are formed to respectively coupled to gate structures 220. That is, each of the gate contacts 290-1, 290-2, 290'-1, and 290'-2 extends through the second dielectric layer 282, the CESL 280, the first SAC dielectric material 250, and the liner 230 to be in contact with a single gate structure 220. Because the gate contacts 290-2 and 290'-2 are formed into asymmetric gate contact openings 286-2 and 286'-2, they too are asymmetric along the Z-axis. In some other embodiments illustrated in FIGS. 15C and 15D, two neighboring gate structures 220 are shorted via a common gate contact, such as a first common gate contact 290-3 in FIG. 15C or a second common gate contact 290'-3 in FIG. 15D. The first common gate contact 290-3 is formed in two interconnected neighboring gate contact openings 286 and includes a bridge portion spanning over and in contact with the second SAC dielectric material 270 between two neighboring gate contact openings 286 (shown in FIG. 14A). The second common gate contact 290'-3 is formed in two interconnected neighboring gate contact openings 286' and includes a bridge portion spanning over and in contact with the second SAC dielectric material 270 between two neighboring gate contact openings 286' (shown in FIG. 14B).

It is noted while the gate contact 290 is depicted as having a uniform width W that is substantially equal to the spacing S between two spacer features (such as between spacer features 210-1 and 210-2, between spacer features 210-3 and 210-4, and between spacer features 210-5 and 210-6), the present disclosure fully contemplates gate contacts that have a width W that is smaller or greater than the spacing S between spacer features. In addition, the present disclosure fully contemplates gate contacts that have a greater width above the spacer features and a smaller width between the spacer features. That is, the present disclosure contemplates gate contacts having non-uniform width when transition from between spacer features to above spacer features. In some embodiments shown in FIGS. 15A and 15B, the gate contacts 290-1 and 290'-1 land squarely on the gate structures 220 below and the liner 230 does not extend between the gate contacts 290-1 and 290'-1 and spacers features 210-1 and 210-2.

Referring to FIG. 1, method 100 includes a block 126 where further processes are performed. Such further processes may include process for forming further structures for interconnecting devices fabricated in the workpiece 200. For the example, such further processes may include deposition of an ILD layer over the workpiece 200, formation of gate contact vias, formation of source/drain contact vias, formation of metal lines, and formation of power rails.

Method 300 in FIG. 16 is representative of an alternative embodiment of method 100 in FIG. 1. As compared to method 100, method 300 includes operations to reduce or even eliminate liner 230 in the gate contact opening so as to reduce parasitic capacitance introduced by the high dielectric constant of the liner 230.

Figure 17:
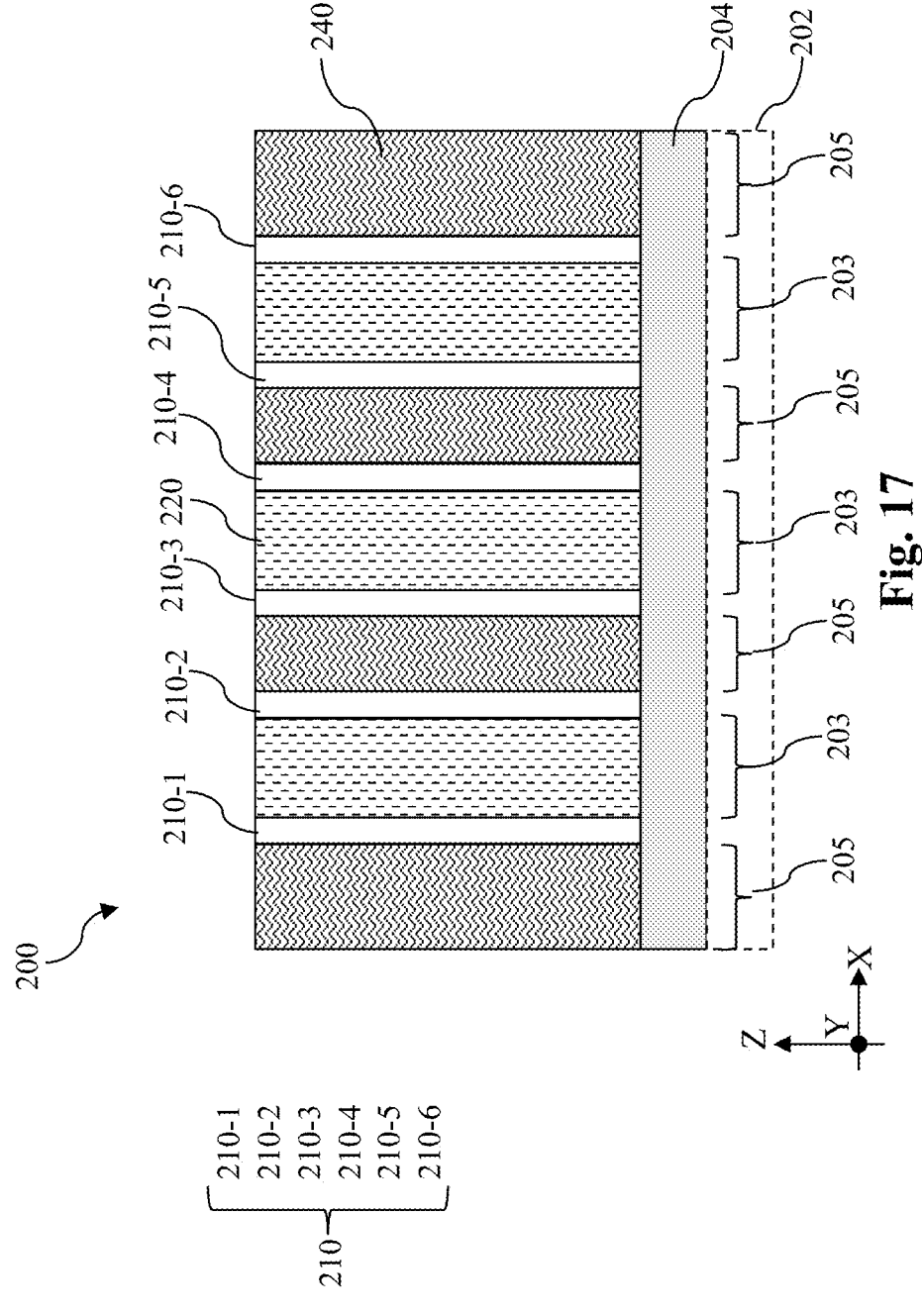

Referring to FIGS. 16 and 17, method 300 includes a block 302 where a workpiece 200 is received. As shown in FIG. 17, the workpiece 200 includes gate structures 220 disposed over channel regions 203 in a first dielectric layer 240 and a spacer 210 disposed between the gate structure 220 and the first dielectric layer 240. In some embodiments, each of the gate structures 220 may be a gate structure for a FinFET or a GAA transistor that includes an active region 204 over a substrate 202. In these embodiments, the active region 204 may be a semiconductor fin of a FinFET or a topmost nanostructure (i.e., a nanowire, a nanosheet, or a channel member) of a stack of nanostructures of a GAA transistor. Descriptions of the substrate 202, the active region 204, the gate structure 220, the first dielectric layer 240, and the spacer 210 are provided above in conjunction with description of method 100 and will not be repeated here. For ease of illustration, substrate 202 is omitted from FIGS. 18-31, 32A, 32B, 33A, and 33B.

Figure 18:
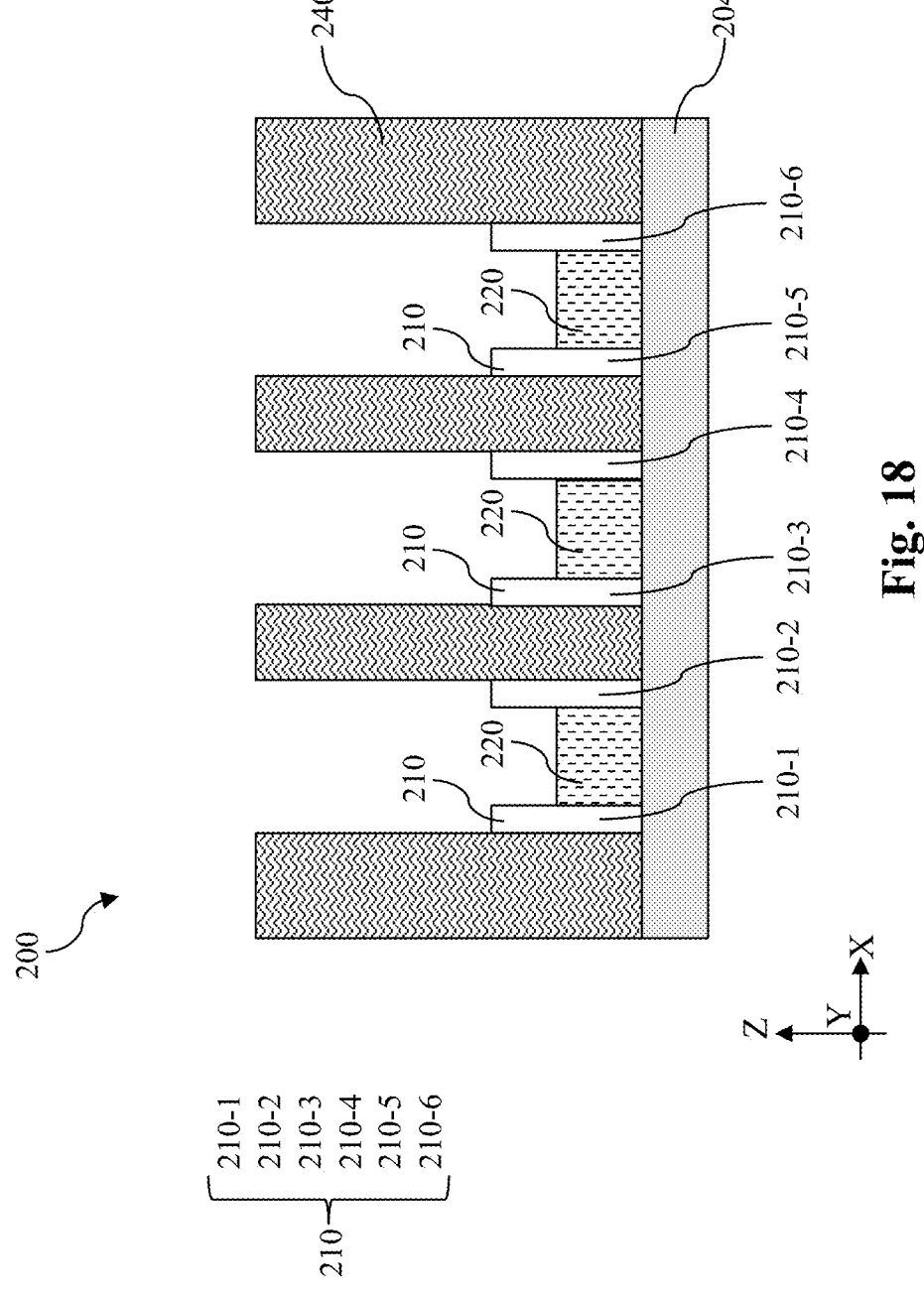

Referring to FIGS. 16 and 18, method 300 includes a block 304 where the gate structure 220 and the spacer 210 are selectively etched to form a first contact recess 212. In some embodiments, block 104 includes an etch process that selectively etches the gate structure 220 and the spacer 210 without substantially etching the first dielectric layer 240. The etch process at block 304 may include a dry etch, a wet dry, a combination thereof, or other suitable etch process. In some implementations illustrated in FIG. 18, the etching process at block 104 includes at least one component that etches the gate structure 220 at a greater than rate than it etches the spacer 210 such that the a top surface of the gate structure 220 is lower than a top surface of the spacer 210, measured from a top surface of the active region 204 along the Z direction. Put differently, the first contact recess 212 includes a space directly between two spacer features of the spacer 210 (such as spacer features 210-1 and 210-2, spacer features 210-3 and 210-4, and spacer features 210-5 and 210-6). The first contact recess 212 exposes sidewalls of the first dielectric layer 240, top surfaces of the spacer 210, sidewalls of the spacer 210 and a top surface of the gate structure 220. For ease of reference, the metal fill layer and the one or more work function layers may be collectively referred to as the gate electrode of the gate structure 220. Operations at block 304 selectively etch the gate electrode of the gate structures 220 as well as the spacer 210 while the first dielectric layer 240 is not substantially etched.

Figure 19:
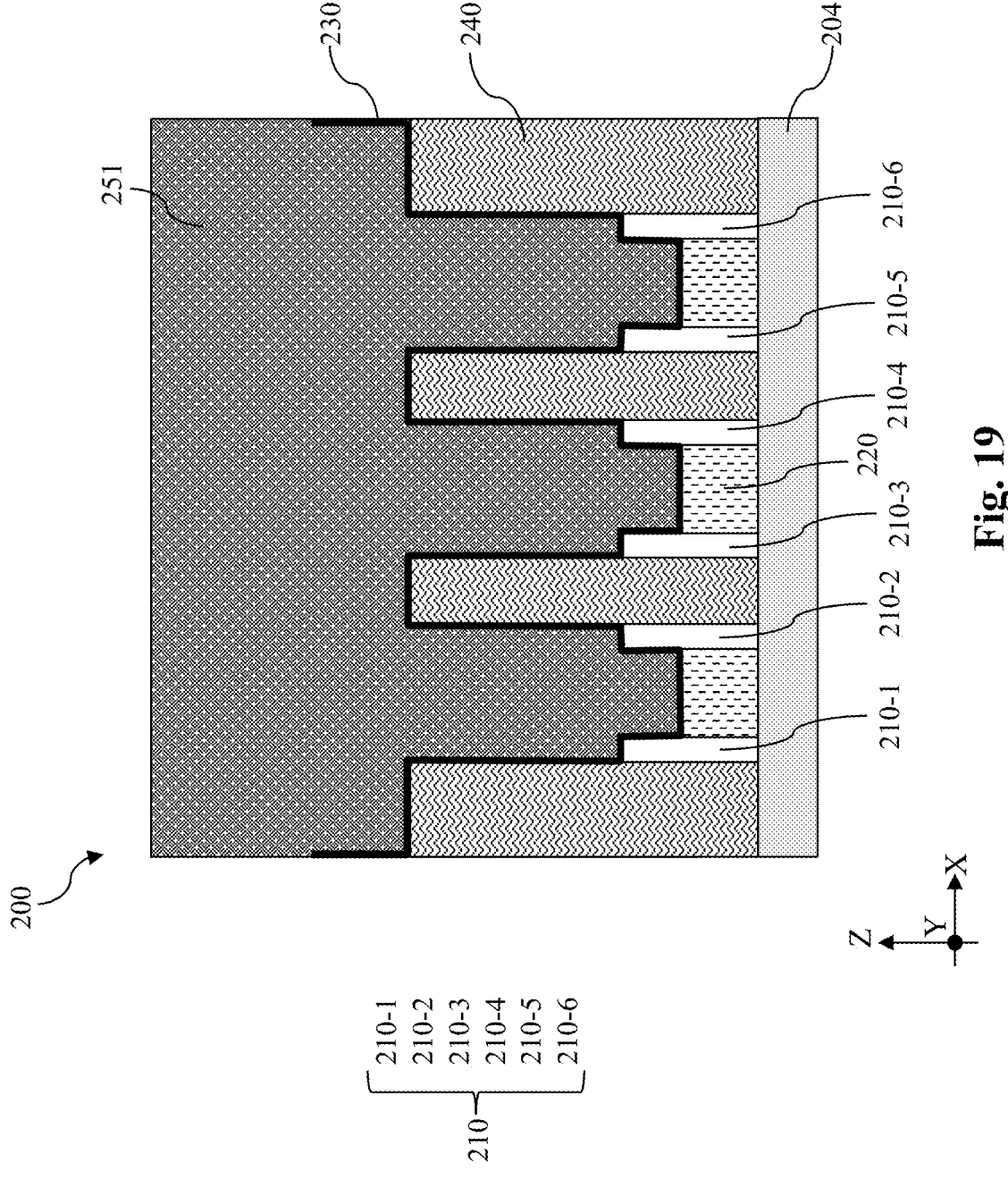

Referring to FIGS. 16 and 19, method 300 includes a block 306 where a liner 230 is deposited over the workpiece 200. In some embodiments, the liner 230 is conformally deposited over the workpiece 200, including over and along surfaces exposed in the first contact recess 212. As shown in FIG. 19, such exposed surfaces include sidewalls of the first dielectric layer 240, top surfaces of the spacer 210, sidewalls of the spacer 210 and a top surface of the gate structure 220. In these embodiments, the liner 230 may be deposited using atomic layer deposition (ALD) or a suitable deposition process to a thickness between about 1 nm and about 10 nm. The liner 230 may be formed of silicon oxide, hafnium silicide, silicon oxycarbide, aluminum oxide, zirconium silicide, aluminum oxynitride, zirconium oxide, hafnium oxide, hafnium zirconium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. In one embodiment, the liner 230 is formed of hafnium zirconium oxide. As will be described further below, the liner 230 serves to protect the spacer 210 from being damaged during etching of a first self-aligned contact (SAC) dielectric material 250 (shown in FIG. 23).

Referring still to FIGS. 16 and 19, method 300 includes a block 308 where a second hard mask layer 251 is deposited over the liner 230. In some embodiments, the second hard mask layer 251 may be deposited over the liner 230 using a deposition technique that has good hole-filling capability. For example, the second hard mask layer 251 may be deposited using high-density-plasma CVD (HDPCVD), plasma enhanced CVD (PECVD), atomic layer deposition (ALD), or a suitable deposition process. The second hard mask layer 251 may be formed of silicon oxide, silicon oxycarbide, silicon nitride, silicon oxycarbonitride, silicon, or silicon carbonitride. In one embodiment, the second hard mask layer 251 is formed of silicon oxide.

Figure 20:
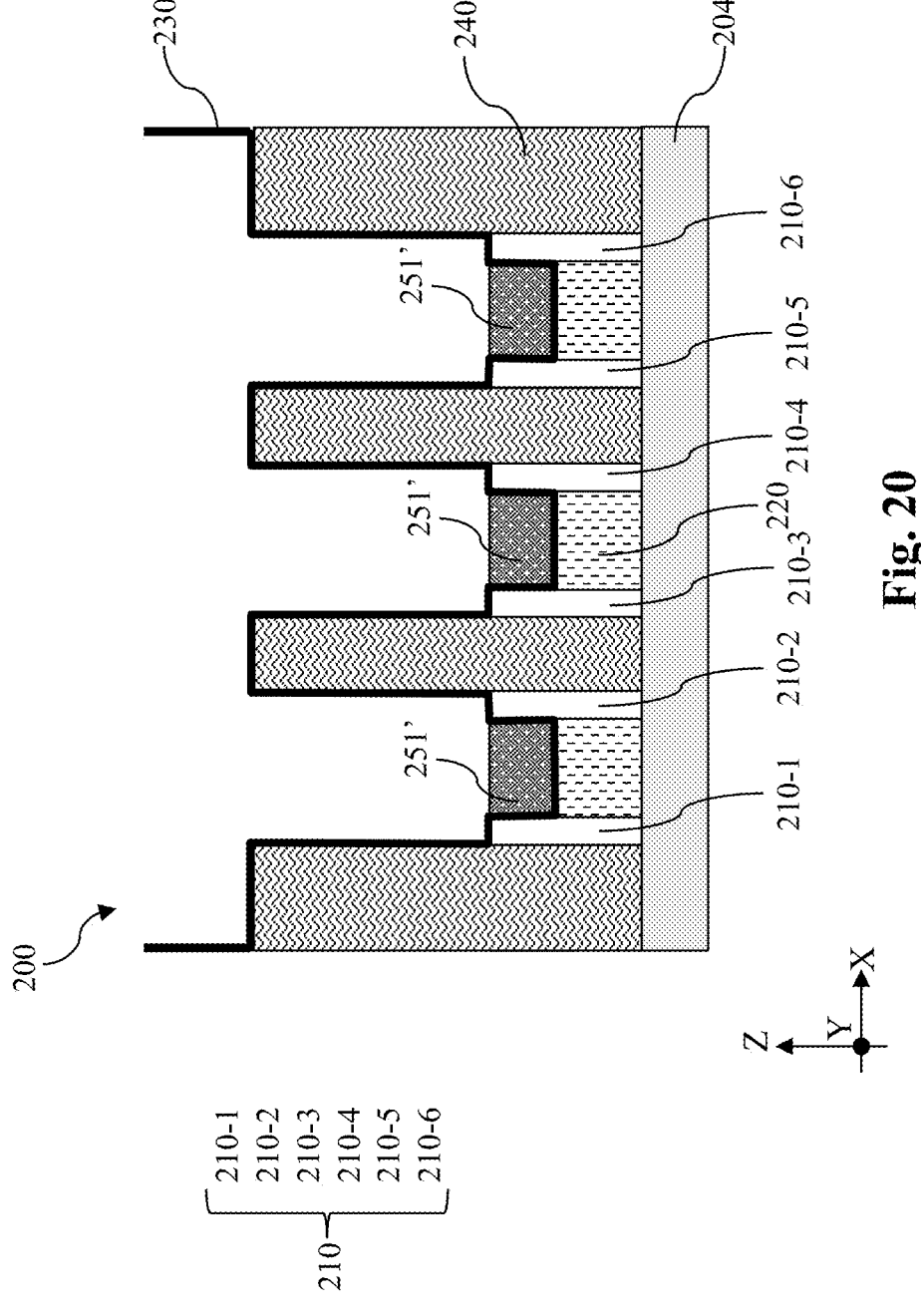

Referring to FIGS. 16 and 20, method 300 includes a block 310 where the second hard mask layer 251 is etched back. As shown in FIG. 20, the material of the second hard mask layer 251 is selected to have an etching selectivity different from that of the liner 230 such that the second hard mask layer 251 may be etched back without harming the liner 230. In some embodiments, the etching back operations at block 310 lasts until that a portion 251' of the second hard mask layer 251 only remains between the spacer features (such as between the spacer features 210-1 and 210-2, spacer features 210-3 and 210-4, and spacer features 210-5 and 210-6). That is, the portion of the second hard mask layer 251 that is above the spacer 210 is completely removed at block 310, leaving an upper portion of the liner 230 exposed.

It is noted that while a top surface of the remaining portion 251' is illustrated in FIG. 20 as being substantially coplanar with top surfaces of the spacer features (such as 210-1, 210-2, 210-3, 210-4, 210-5, or 210-6), the present disclosure fully contemplates remaining portion 251' with a top surface above or below the top surfaces of the spacer features. When the remaining portion 251' covers the liner 230 on top surfaces of the spacer features, the horizontal portion of the liner 230 may remain, which does not substantially contribute to increase of parasitic capacitance. When the top surface of the remaining portion 251' is below the top surfaces of the spacer features, the remaining liner 230 may still provide adequate protection to the spacer features.

Figure 21:
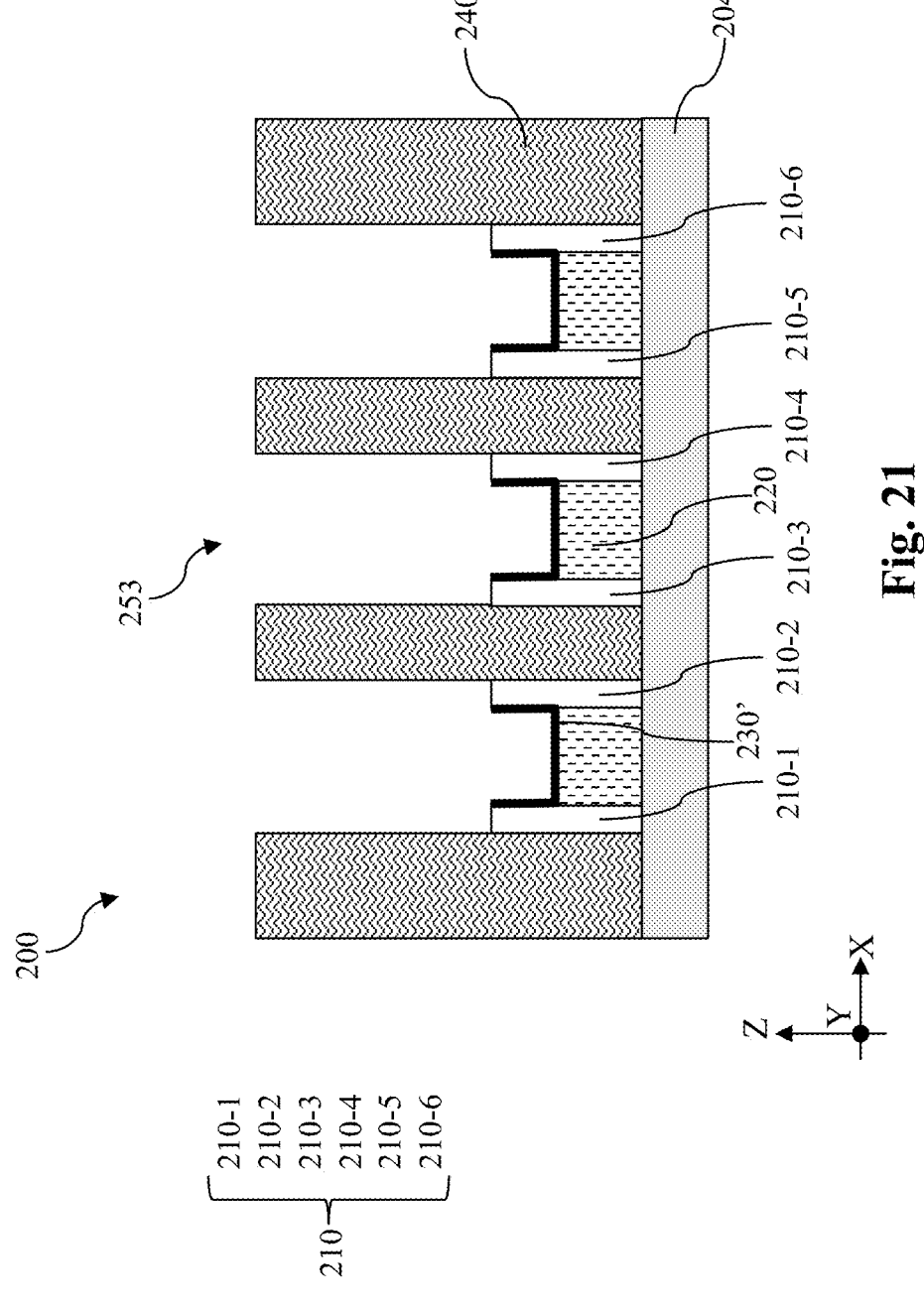

Referring to FIGS. 16 and 21, method 300 includes a block 312 where the exposed portion of the liner 230 and the second hard mask layer 251 are removed. Operations at block 312 may include a first etching process to etch the liner 230 exposed at the conclusion of block 310 and a second etching process to remove the remaining portion 251' of the second hard mask layer 251. During the first etching process, the remaining portion 251' of the second hard mask layer 251 serves as an etch mask to protect the portion of the liner 230 disposed on sidewalls of the spacer 210 and the top surface of the gate structures 220. After the exposed portion of the liner 230 is removed, the remaining portion 251' of the second hard mask layer 251 is removed. As described above, the difference in etching selectivity allows the remaining portion 251' to be selectively removed without harming the remaining liner 230'.

Figure 22:
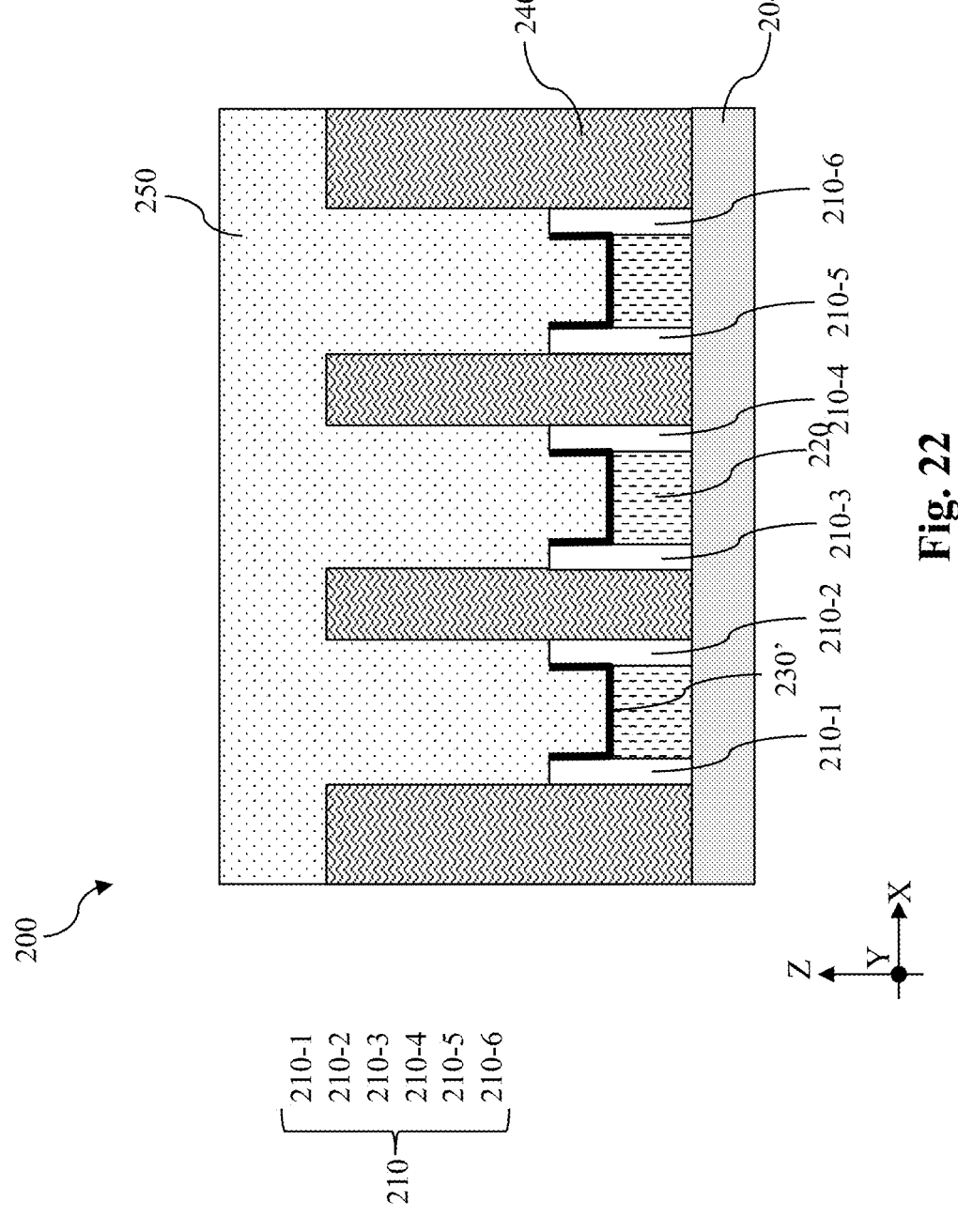
Figure 23:
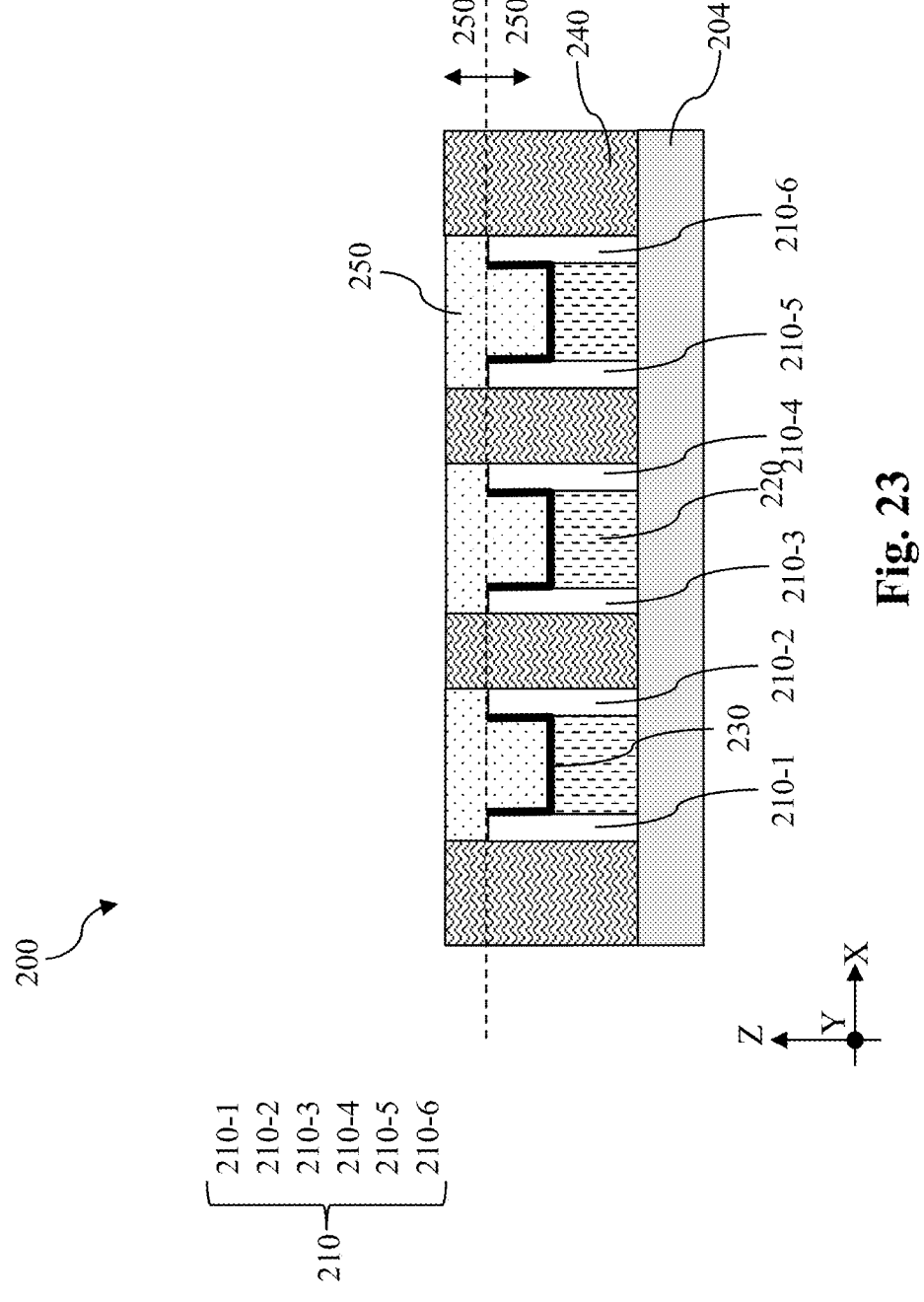

Referring still to FIGS. 16 and 22, method 300 includes a block 314 where a first self-aligned contact (SAC) dielectric material 250 is deposited over the remaining liner 230'. In some embodiments, the first SAC dielectric material 250 may be deposited over the remaining liner 230' using a deposition technique that has good hole-filling capability. For example, the first SAC dielectric material 250 may be deposited using high-density-plasma CVD (HDPCVD), plasma enhanced CVD (PECVD), atomic layer deposition (ALD), or a suitable deposition process. The first SAC dielectric material 250 may be formed of silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. In one embodiment, the first SAC dielectric material 250 is formed of zirconium oxide. Similar to block 108, the block 314 may include a planarization process to provide the workpiece 200 with a planar top surface for subsequent processes, as shown in FIG. 23. The planarization process may be a chemical mechanical polishing (CMP) process.

Figure 24:
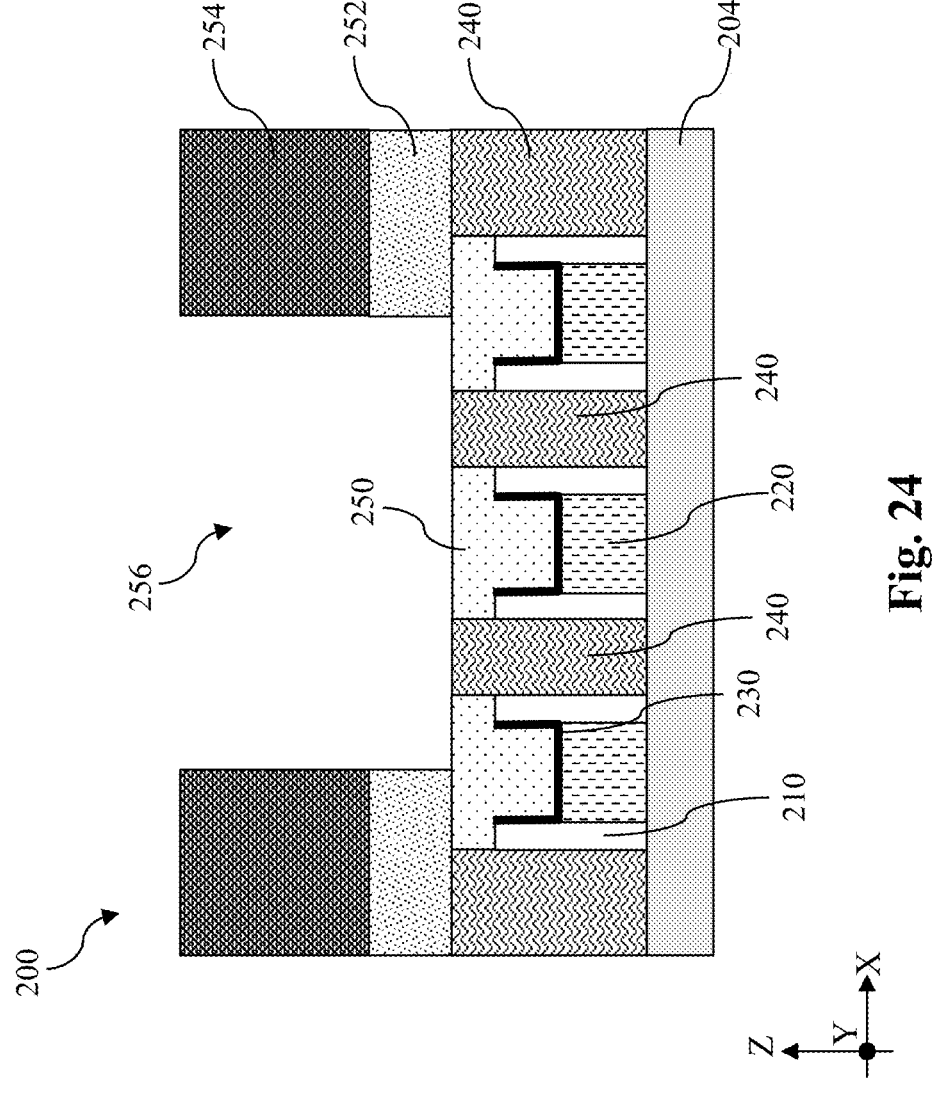
Figure 26:
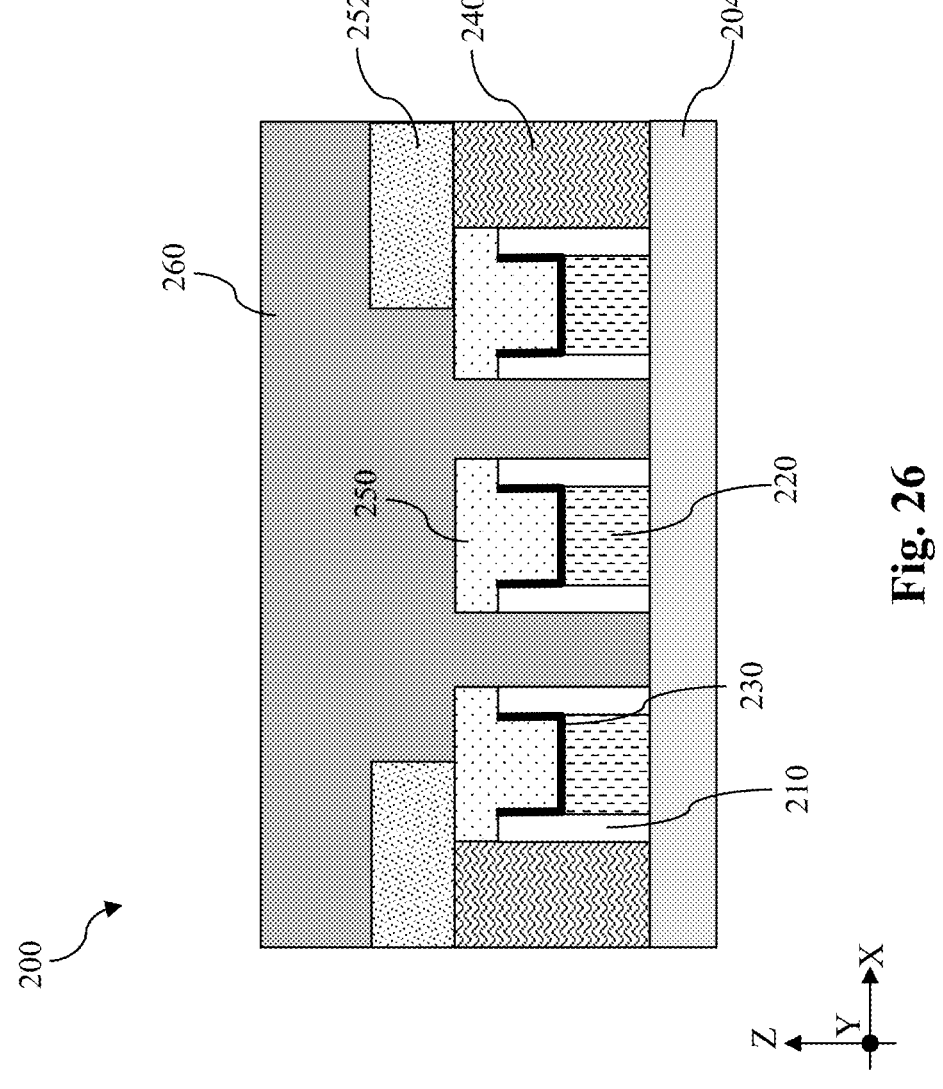

Referring to FIGS. 16, 24, 25, 26, and 27, method 300 includes a block 316 where a source/drain contact 260 adjacent the spacer 210 is formed. Operations at block 316 include formation of a patterned first hard mask layer 252 shown in FIG. 24, formation of source/drain contact opening 258 shown in FIG. 25, formation of the source/drain contact 260 in the source/drain contact opening 258 shown in FIG. 26, and planarization shown in FIG. 27. Reference is first made to FIG. 24. A first hard mask layer 252 is first formed over the workpiece 200 by CVD or a suitable method. The first hard mask layer 252 may be formed of silicon oxide, silicon nitride, or other suitable dielectric material. The first hard mask layer 252 may be a single layer or a multi-layer. For example, the first hard mask layer 252 may include a silicon oxide layer and a silicon nitride layer disposed over the silicon oxide layer. Subsequently, a photoresist layer 254 is deposited over the first hard mask layer 252 using spin-on coating or a suitable method. The photoresist layer 254 may be a single layer or a multi-layer. For example, the photoresist layer 254 may by a tri-layer having three layers. The photoresist layer 254 is patterned using photolithography process to form a patterned photoresist layer 254. The first hard mask layer 252 is then etched using the patterned photoresist layer 254 as an etch mask to form a patterned first hard mask layer 252. The patterned first hard mask layer 252 includes an opening 256 that spans over at least one source/drain region 205.

Referring now to FIG. 25, the workpiece 200 is then etched using the patterned first hard mask layer 252 as an etch mask. As shown in FIG. 25, the workpiece 200 is etched using an etch process that selectively removes the first dielectric layer 240 exposed in the opening 256, so as to form source/drain contact openings 258 over the source/drain regions 205. The source/drain contact openings 258 expose top surfaces of source/drain features in, on, or over the active region 204. The formation of source/drain contacts 260 is representatively illustrated in FIGS. 26 and 27. To electrically couple the source/drain contacts 260 to the source/drain regions 205, a silicide layer (not shown in FIGS. 26 and 27) may be formed on the source/drain features in the source/drain regions 205. For example, a silicide precursor, such as nickel, cobalt and titanium, is deposited over the source/drain features in the source/drain regions 205. The workpiece 200 is then annealed to bring about silicidation reaction between silicon in the source/drain features and the silicide precursor. The silicidation reaction results in a silicide feature, such as nickel silicide, cobalt silicide or titanium silicide. The silicide feature may reduce the contact resistance between the source/drain features in the source/drain regions 205 and the source/drain contacts 260. Thereafter, a conductive material for source/drain contacts 260, such as tungsten, ruthenium, cobalt, copper, titanium, titanium nitride, tantalum, tantalum nitride, molybdenum, or nickel, may be deposited over the workpiece 200, including within the source/drain contact openings 258. Referring now to FIG. 27, the workpiece 200 is then planarized using a suitable planarization technique, such as CMP to provide a planar top surface.

Figure 28:
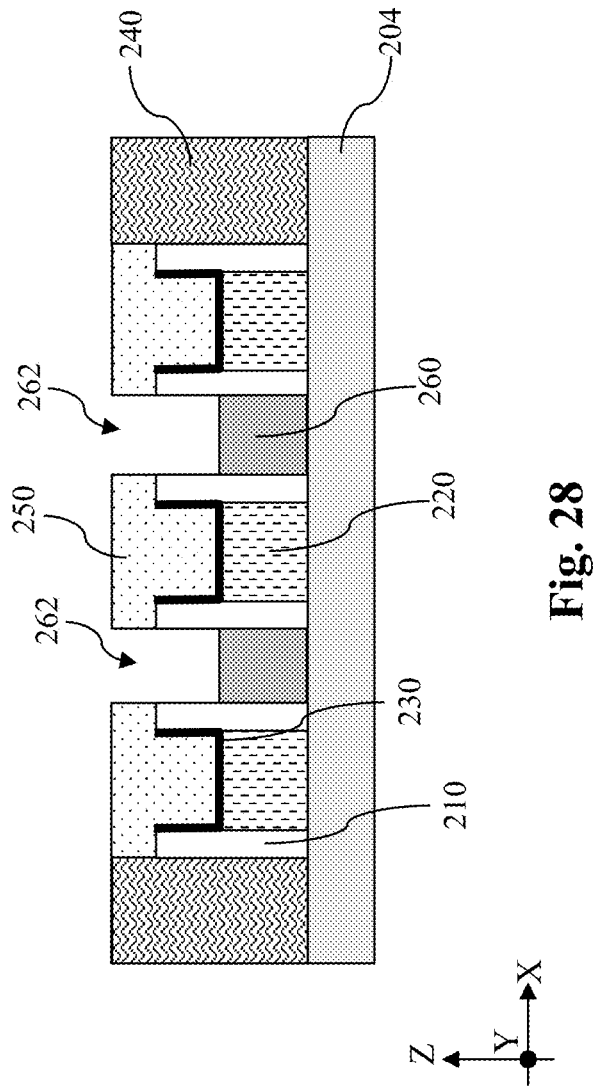

Referring to FIGS. 16 and 28, method 300 includes a block 318 where the source/drain contact 260 is selectively pulled back to form a second contact recess 262. In some embodiments, the source/drain contact 260 is selectively pulled back to make room for the second SAC dielectric material 270 to be deposited in block 320 below. In some implementations, the pull-back process at block 318 is selected such that it selectively etches the source/drain contact 260 without substantially etching the first dielectric layer 240, the liner 230, the spacer 210, and the first SAC dielectric material 250. As shown in FIG. 28, each of the second contact recesses 262 is defined by a top surface of the source/drain contact 260, sidewalls of the spacer 210, and sidewalls of the liner 230. Put differently, a lower portion of the second contact recess 262 is defined between two spacer features (such as between spacer features 210-2 and 210-3 or between spacer features 210-4 and 210-5) and an upper portion of the second contact recess 262 is disposed between two segments of the liner 230. After operations at block 318, the pulled-back source/drain contact 260 may have a thickness between about 1 nm and about 50 nm.

Figure 29:
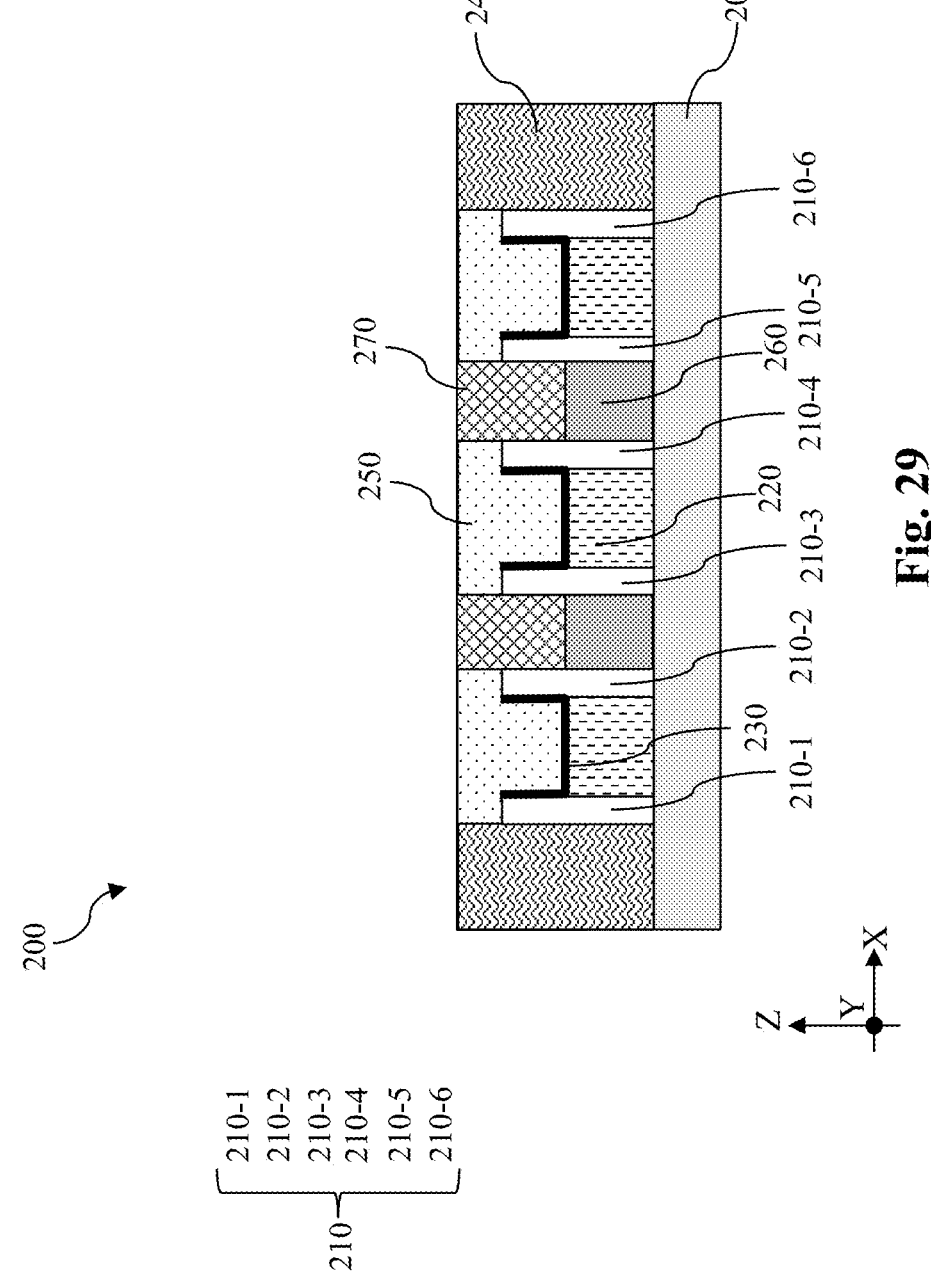

Referring to FIGS. 16 and 29, method 300 includes a block 320 where a second SAC dielectric material 270 is deposited in the second contact recess 262. In some embodiments, the second SAC dielectric material 270 may be deposited over the liner 230 using a deposition technique that has good hole-filling capability. For example, the second SAC dielectric material 270 may be deposited using HDPCVD, PECVD, ALD, or a suitable deposition process. The second SAC dielectric material 270 may be formed of silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. The second SAC dielectric material 270 is selected such that it has different etching selectivity from the first SAC dielectric material 250. After the deposition of the second SAC dielectric material 270, the workpiece 200 is planarized by a suitable planarization technique, such as CMP, to provide a planar top surface.

Figure 30:
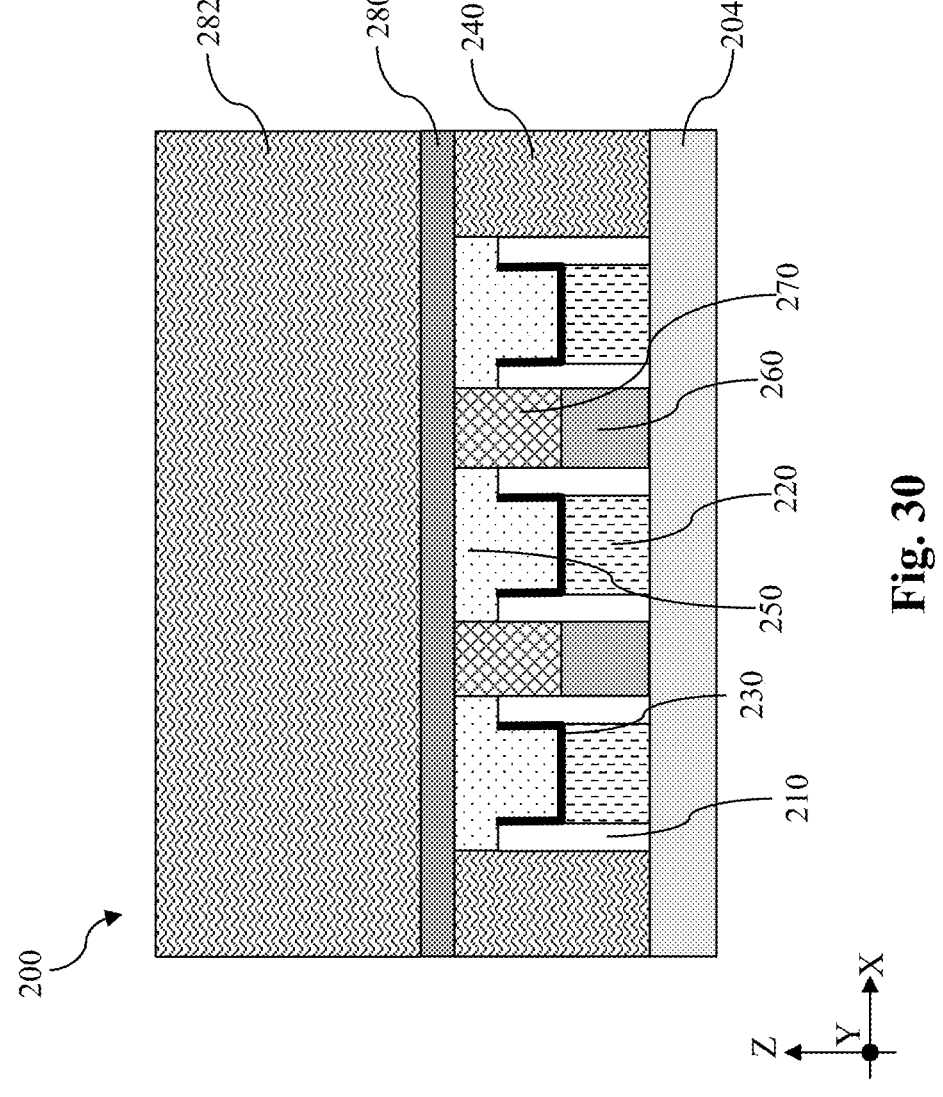

Referring to FIGS. 16 and 30, method 300 includes a block 322 where a contact etch stop layer (CESL) 280 is deposited over the workpiece 200. The CESL 280 may be formed of silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. In some implementations, the CESL 280 may be deposited using CVD, ALD, or a suitable deposition method. In one embodiment, the CESL 280 is formed of silicon nitride and has a thickness between about 1 nm and about 30 nm.

Referring still to FIGS. 16 and 30, method 300 includes a block 324 where a second dielectric layer 282 is deposited over the CESL 280. In some embodiments, the composition and deposition method of the second dielectric layer 282 may be substantially identical to those of the first dielectric layer 240. Details regarding the formation and material of the second dielectric layer 282 are omitted for brevity.

Figure 31:
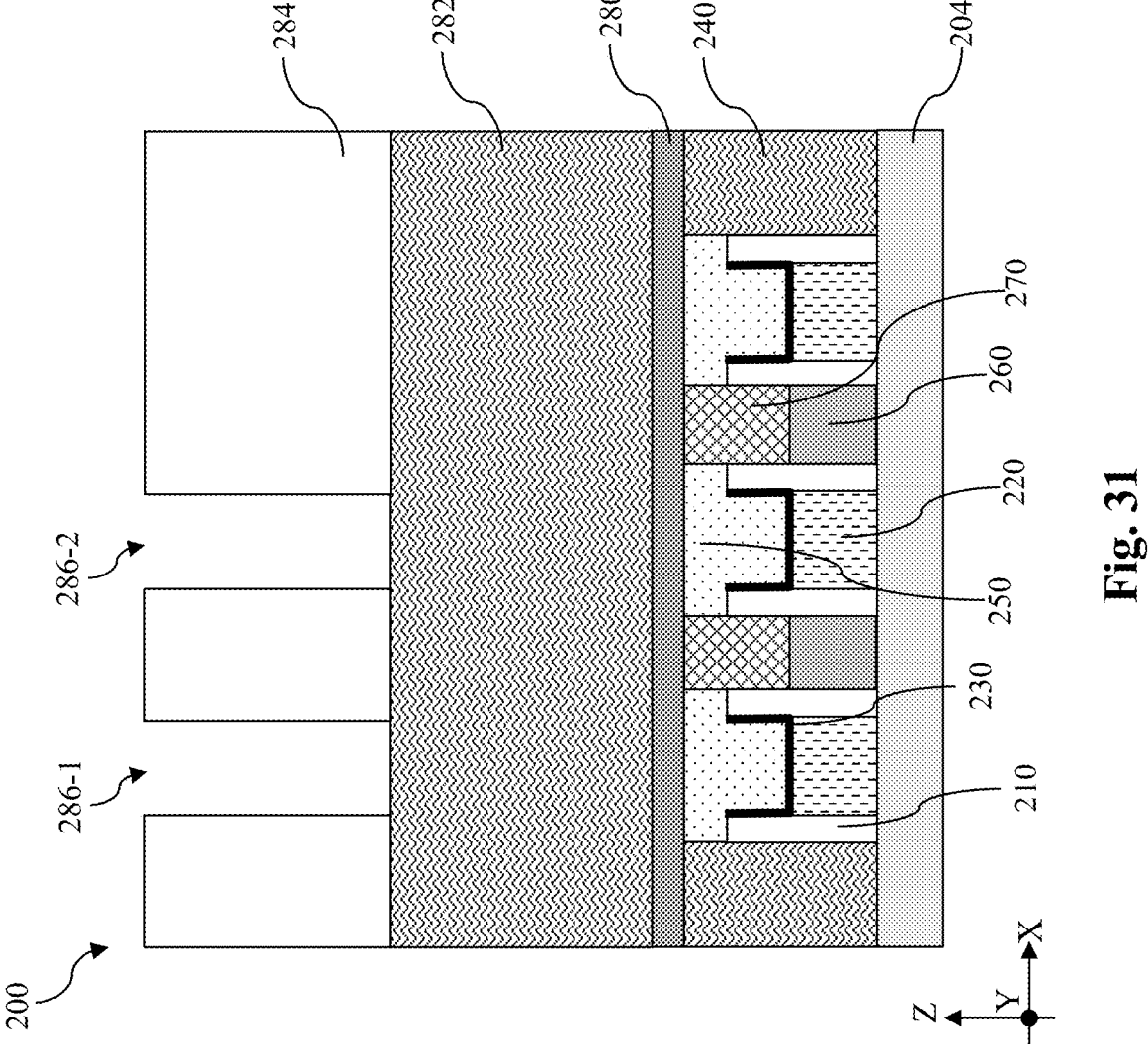
Figure 32A:
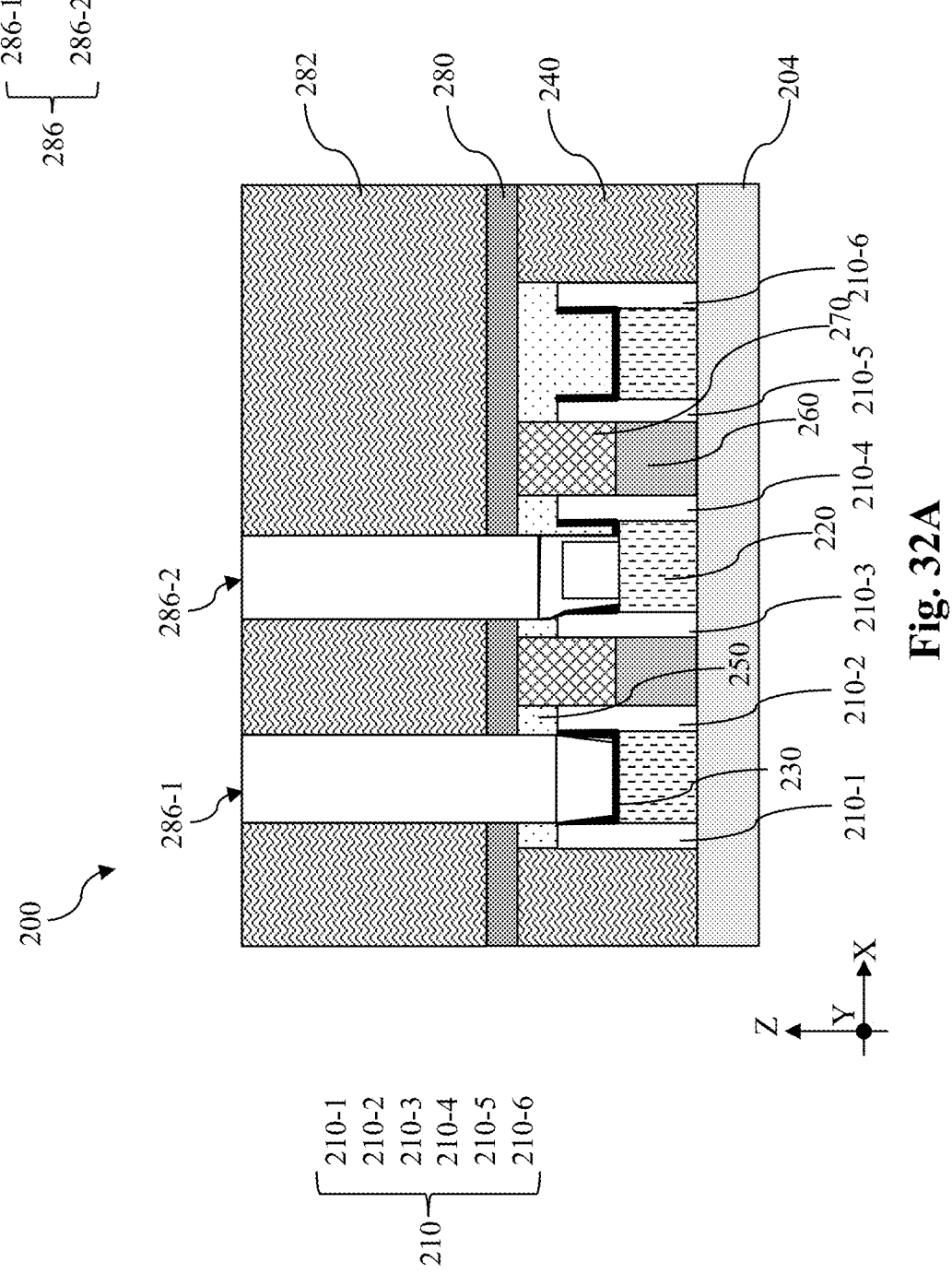

Referring to FIGS. 16, 31, 32A, method 300 includes a block 326 where gate contact openings 286 are formed to expose the gate structure 220. A combination of photolithography processes and etching processes may be used to form the gate contact openings 286. In some embodiments illustrated in FIG. 31, a photoresist layer 284 is first deposited over the second dielectric layer 282. The photoresist layer 284 may be substantially similar to photoresist layer 254. Detailed description of the photoresist layer 284 is therefore omitted for brevity. As shown in FIG. 31, the photoresist layer 284 is patterned using photolithography processes. Reference is then made to FIG. 32A. The patterned photoresist layer 284 is used as an etch mask to form the gate contact openings 286 through the second dielectric layer 282, the CESL 280, the first SAC dielectric material 250, and the liner 230, so as to expose top surfaces of the gate structures 220.

In some instances represented in FIG. 32A, the gate contact openings 286 may not always completely align with the gate structures 220. For example, a first gate contact opening 286-1 in FIG. 32A is substantially aligned with the underlying gate structure 220 while a second gate contact opening 286-2 in FIG. 32A overlaps but misaligns with the underlying gate structure 220. Compared to the second gate contact opening 286-2, the first gate contact opening 286-1 is preferable because the spacer features 210-1 and 210-2 are not etched. The misalignment in the second gate contact opening 286-2 causes uneven etching toward the third spacer feature 210-3. Because material of the liner 230 is selected to have different etching selectivity than the first SAC dielectric material 250, the liner 230 of the present disclosure protects the spacer feature 210-3 from being etched. In some instances, a portion of the liner 230 exposed in the gate contact opening 286-2 may be etched to have a height lower than that of the gate spacer feature 210-3 while another portion of the liner 230 and the gate spacer feature 210-4 share substantially the same height. As shown in FIG. 32A, at least a portion of the liner 230 is exposed in the gate contact openings 286. Some of the gate structures 220 may not include a gate contact opening formed thereover. For example, no gate contact opening is formed between the spacers features 210-5 and 210-6 to couple to the underlying gate structure 220. In those instances, the first SAC dielectric material 250 and the liner 230 remain intact.

Figure 32B:
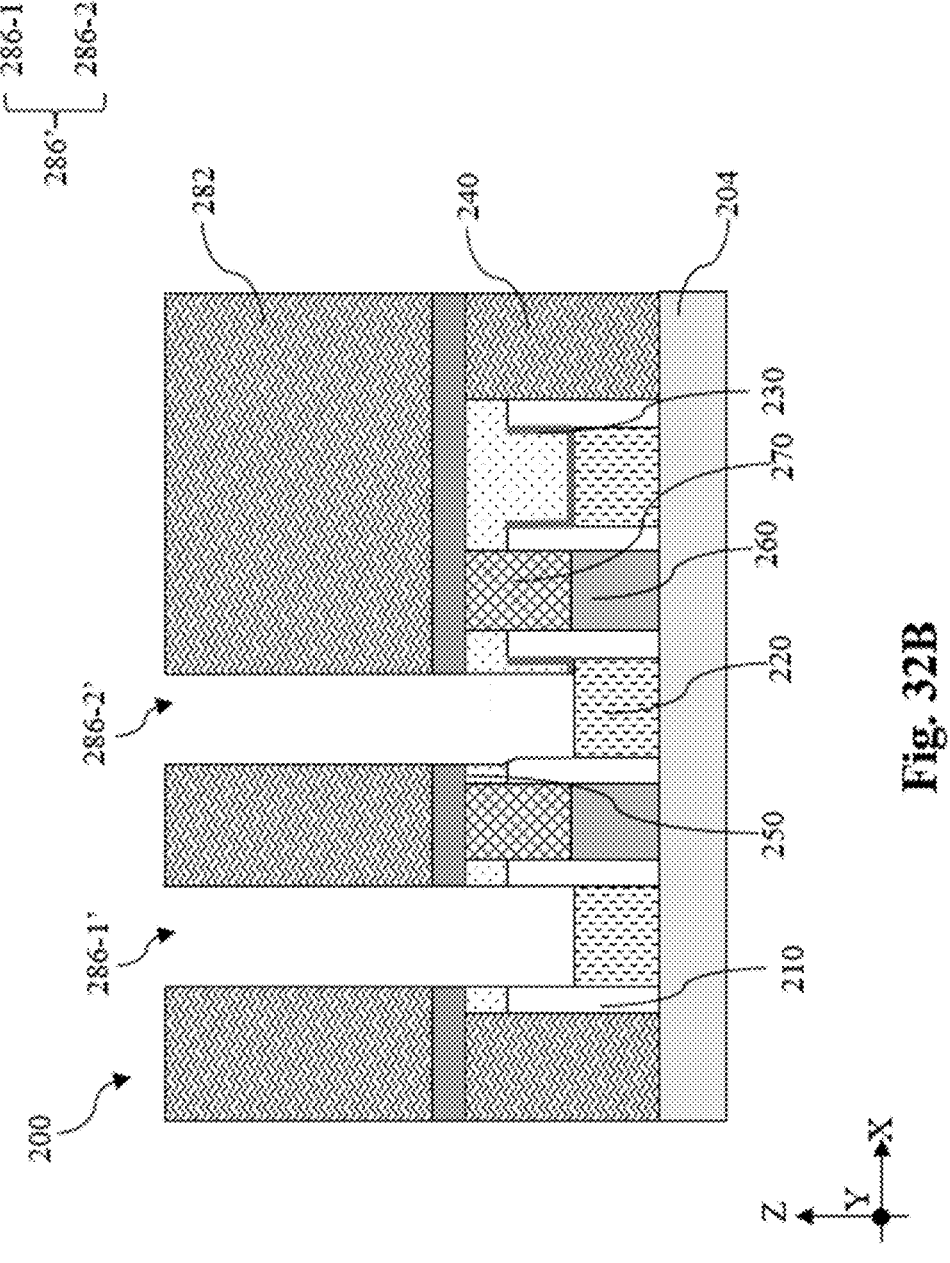
Figure 33A:
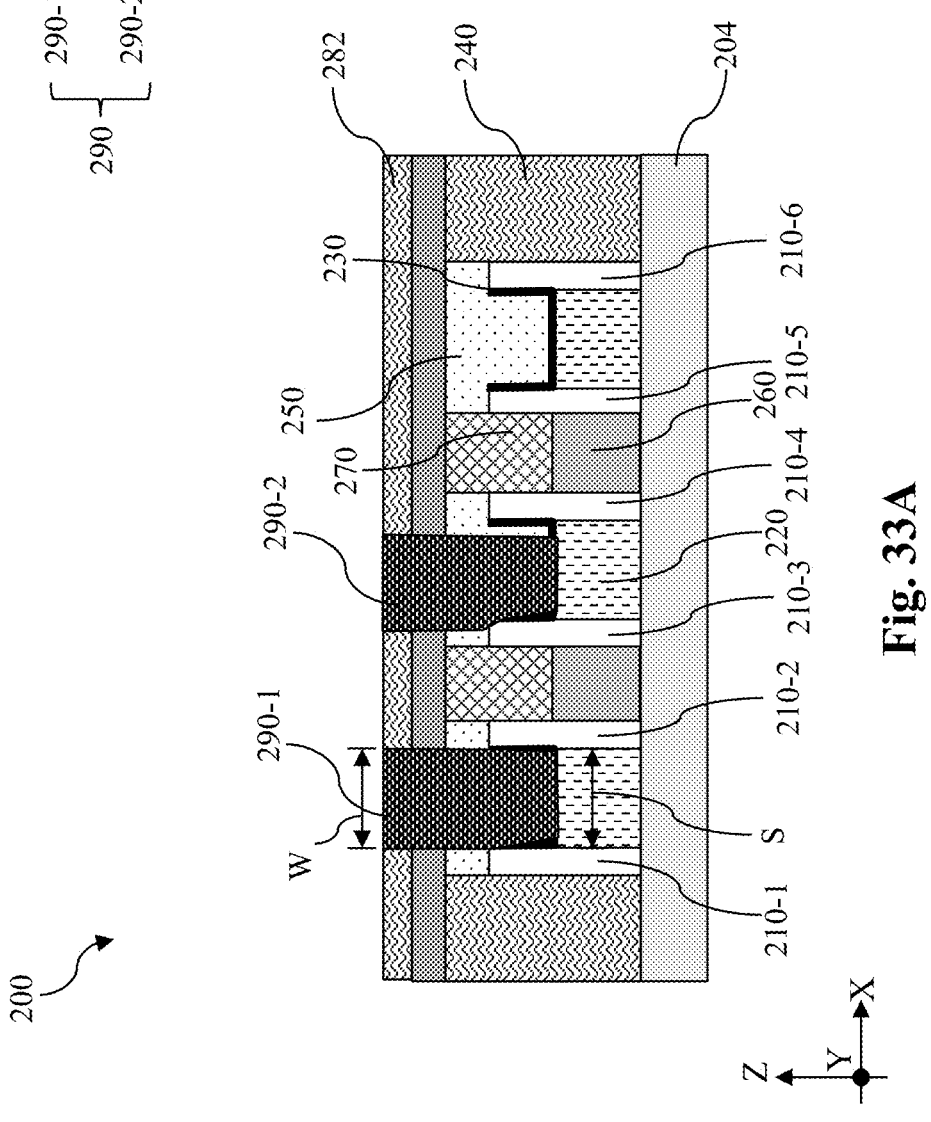
Figure 33B:
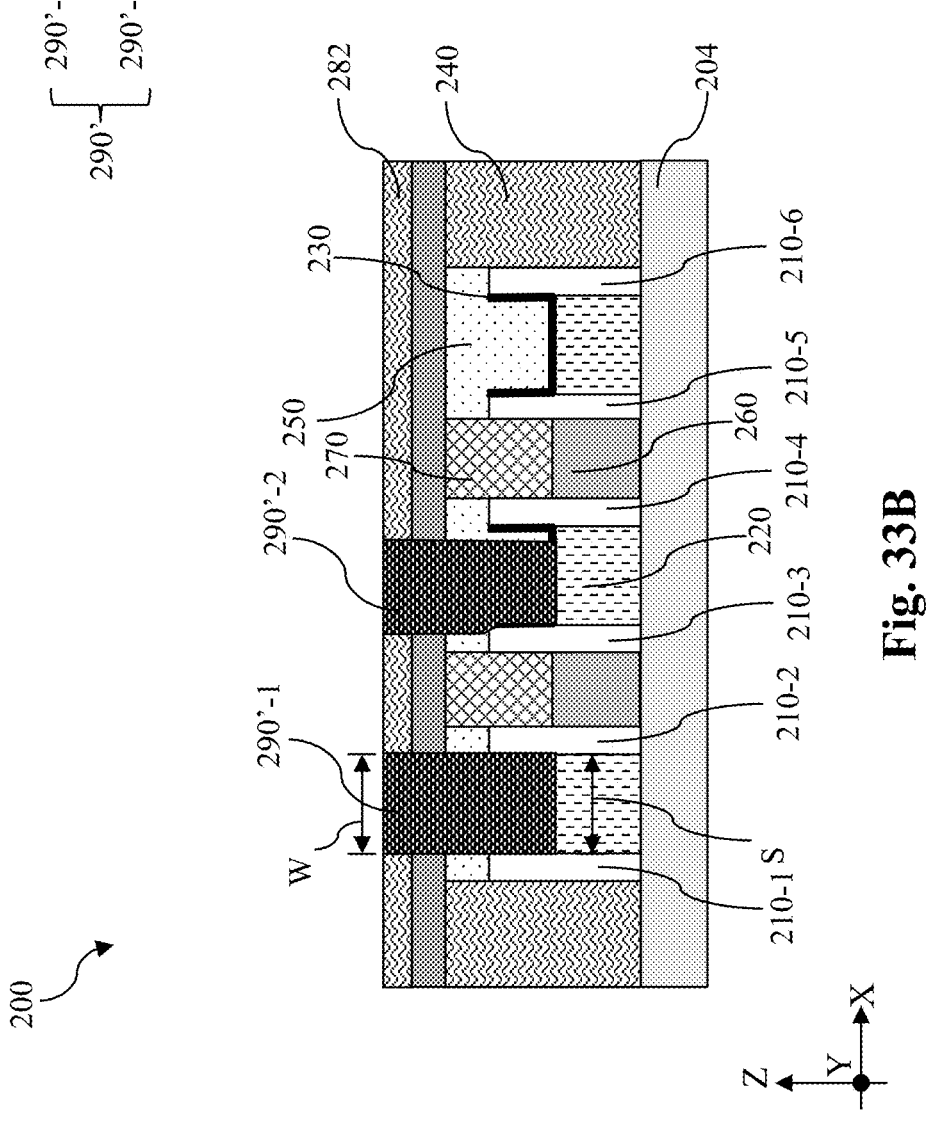
Figure 33C:
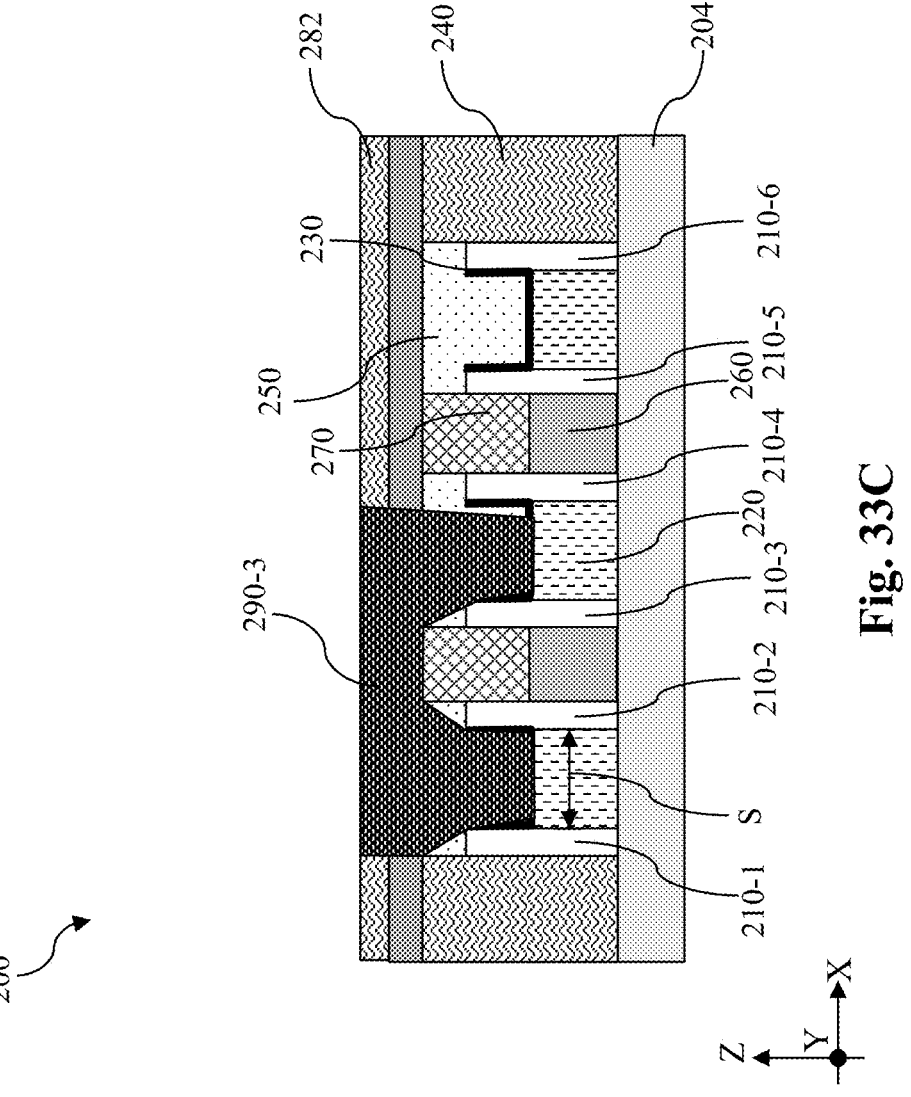

Referring to FIGS. 16 and 32B, method 300 may optionally include a block 328 where the remaining liner 230' in the gate contact openings 286 is trimmed. In some embodiments, a portion of the remaining liner 230' in the gate contact openings 286 may be removed to increase room for gate contact deposition. As shown in FIG. 32B, operations at block 328 not only remove a portion of the remaining liner 230' but also a portion of the first SAC dielectric material 250 in the gate contact openings 286. In some implementations represented in FIG. 32B, sidewalls of the spacer 210 may become exposed in the gate contact openings 286'. As compared to the gate trenches 286 in FIG. 32A, the gate trenches 286' in FIG. 32B are wider along the X direction between spacer features due to removal of the portion of liner 230. Operations at block 122 have several benefits. For example, the removal of a portion of the liner 230 may made more room for gate contact 290 at block 330. For another example, because the liner 230 may be formed of high-k dielectric materials, removal of high-k liner 230 helps reduce parasitic capacitance. In some embodiments represented in FIG. 32A, the gate contact opening 286-2 may not be perfectly aligned with the gate structure 220 and may be partially disposed over the spacer 210. In these embodiments, the gate contact opening 286-2 is asymmetric with respect to a center line of the gate contact opening 286-2 along the Z direction. Similarly, as shown in FIG. 32B, the gate contact opening 286'-2 may be disposed over the spacer 210 and is asymmetric with respect to a center line of the gate contact opening 286'-2 along the Z direction.

Referring to FIGS. 16 and 33A-33D, method 300 includes a block 330 where a gate contact 290 (290') is formed in the gate contact opening 286 (286'). As used herein, a gate contact 290 illustrated in FIGS. 33A and 33C and refers to types of gate contacts formed in the gate openings 286 shown in FIG. 32A; and a gate contact 290' illustrated in FIGS. 33B and 33D and refers to types of gate contacts formed in the gate openings 286' shown in FIG. 32B. In some embodiments, a conductive material, such as tungsten, ruthenium, cobalt, copper, titanium, titanium nitride, tantalum, tantalum nitride, molybdenum, or nickel, may be deposited over the workpiece 200, including within the gate contact openings 286 in FIG. 32A or 286' in FIG. 32B. The workpiece 200 is then planarized to form gate contacts 290 in FIGS. 33A and 33C and gate contacts 290' in FIGS. 33B and 33D. In some embodiments illustrated in FIGS. 33A and 33B, gate contacts are formed to respectively coupled to gate structures 220. That is, each of the gate contacts 290-1, 290-2, 290'-1, and 290'-2 extends through the second dielectric layer 282, the CESL 280, the first SAC dielectric material 250, and the liner 230 to be in contact with a single gate structure 220. Because the gate contacts 290-2 and 290'-2 are formed into asymmetric gate contact openings 286-2 and 286'-2, they too are asymmetric with respect to their center lines along the Z direction. In some other embodiments illustrated in FIGS. 33C and 33D, two neighboring gate structures 220 are shorted via a common gate contact, such as a first common gate contact 290-3 in FIG. 33C or a second common gate contact 290'-3 in FIG. 33D. The first common gate contact 290-3 is formed in two interconnected neighboring gate contact openings 286 and includes a bridge portion spanning over and in contact with the second SAC dielectric material 270 between two neighboring gate contact openings 286 (shown in FIG. 32A). The second common gate contact 290'-3 is formed in two interconnected neighboring gate contact openings 286' and includes a bridge portion spanning over and in contact with the second SAC dielectric material 270 between two neighboring gate contact openings 286' (shown in FIG. 32B).

It is noted while the gate contact 290 is depicted as having a uniform width W that is substantially equal to the spacing S between two spacer features (such as between first spacer feature 210-1 and second spacer feature 210-2, between third spacer feature 210-3 and fourth spacer feature 210-4, and between fifth spacer feature 210-5 and sixth spacer feature 210-6). The present disclosure fully contemplates gate contacts that have a width W that is smaller or greater than the spacing S between spacer features. In addition, the present disclosure fully contemplates gate contacts that have a greater width above the spacer features and a smaller width between the spacer features. That is, the present disclosure contemplates gate contacts having non-uniform width when transition from between spacer features to above spacer features. In some embodiments shown in FIGS. 33A and 33B, the gate contacts 290-1 and 290'-1 land squarely on the gate structures 220 below and the liner 230 does not extend between the gate contacts 290-1 and 290'-1 and spacers features 210-1 and 210-2.

Referring to FIG. 16, method 300 includes a block 332 where further processes are performed. Such further processes may include process for forming further structures for interconnecting devices fabricated in the workpiece 200. For the example, such further processes may include deposition of an ILD layer over the workpiece 200, formation of gate contact vias, formation of source/drain contact vias, formation of metal lines, and formation of power rails.

Thus, the various embodiments described herein offer several advantages over the existing art. It will be understood that not all advantages have been necessarily discussed herein, no particular advantage is required for all embodiments, and other embodiments may offer different advantages. For example, embodiments discussed herein include forming a liner before deposition of a self-aligned contact (SAC) dielectric layer over a gate structure. Because materials of the SAC dielectric layer and the liner are selected such that the SAC dielectric layer may be selectively etched, the liner serves to protect integrity of gate spacers from being harmed during formation of gate contact openings through the SAC dielectric layer. The implementation of the liner of the pre sent disclosure prevents detrimental gate spacer loss that may lead to shorts, leakage or increased parasitic capacitance. Method embodiments of the present disclosure also include process steps to adjust the height and amount of liner in the gate contact opening to meet design requirements with respect to gate contact resistance and parasitic capacitance. Additional embodiments and advantages will be evident to those skilled in the art in possession of this disclosure.

Thus, one of the embodiments of the present disclosure provides a semiconductor device. A semiconductor device includes a gate structure sandwiched between and in contact with a first spacer feature and a second spacer feature, a top surface of the first spacer feature and a top surface of the second spacer feature extending above a top surface of the gate structure, a gate self-aligned contact (SAC) dielectric feature over the first spacer feature and the second spacer feature, a contact etch stop layer (CESL) over the gate SAC dielectric feature, a dielectric layer over the CESL, a gate contact feature extending through the dielectric layer, the CESL, the gate SAC dielectric feature, and between the first spacer feature and the second spacer feature to be in contact with the gate structure, and a liner disposed between the first spacer feature and the gate contact feature.

In some embodiments, a composition of the liner is different a composition of the gate SAC dielectric feature. In some implementations, the liner includes a first portion adjacent the first spacer feature and a second portion adjacent the second spacer feature and the first portion is disposed between the first spacer feature and the gate contact feature and the second portion is spaced apart from the gate contact feature by a portion of the gate SAC dielectric feature. In some implementations, the liner includes a first portion adjacent the first spacer feature and a second portion adjacent the second spacer feature and a height of the first portion from the gate structure is different from a height of the second portion from the gate structure. In some instances, the liner includes silicon oxide, hafnium silicide, silicon oxycarbide, aluminum oxide, zirconium silicide, aluminum oxynitride, zirconium oxide, hafnium oxide, hafnium zirconium oxide, titanium oxide, zirconium aluminum oxide, zinc oxide, tantalum oxide, lanthanum oxide, yittrium oxide, tantalum carbonitride, silicon nitride, silicon oxycarbonitride, silicon, zirconium nitride, or silicon carbonitride. In some implementations, the semiconductor device may further include a source/drain (S/D) contact adjacent the second spacer feature, and a S/D self-aligned contact (SAC) dielectric feature disposed on the S/D contact. A portion of the liner is disposed between the gate SAC dielectric feature and the S/D SAC dielectric feature. In some examples, a portion of the liner is disposed over at least one of a top surface of the first spacer feature and a top surface of the second spacer feature.

In another of the embodiments, a semiconductor device is provided. The semiconductor device includes a first gate structure sandwiched between and in contact with a first spacer feature and a second spacer feature, a top surface of the first spacer feature and a top surface of the second spacer feature extending above a top surface of the first gate structure, a second gate structure sandwiched between and in contact with a third spacer feature and a fourth spacer feature, a top surface of the third spacer feature and a top surface of the fourth spacer feature extending above a top surface of the second gate structure, a first gate self-aligned contact (SAC) dielectric feature over the first spacer feature and the second spacer feature, a second gate SAC dielectric feature over the third spacer feature, the second gate structure, and the fourth spacer feature, a dielectric layer over the first gate SAC dielectric feature and the second gate SAC dielectric feature, a gate contact feature extending through the dielectric layer and the first gate SAC dielectric feature, and between the first spacer feature and the second spacer feature to be in contact with the first gate structure, and a liner disposed between the first spacer feature and the first gate SAC dielectric feature and disposed between the third spacer feature and the fourth spacer feature.

In some embodiments, the gate contact feature is in contact with the first spacer feature and the second spacer feature and the liner does not extend between the gate contact feature and the second spacer feature. In some implementations, the second gate SAC dielectric feature extends between the third spacer feature and the fourth spacer feature. In some implementations, the liner is disposed between the second gate SAC dielectric feature and the second gate structure. In some instances, the gate contact feature is asymmetric with respect to a center line of the gate contact feature. In some implementations, the semiconductor device may further include a contact etch stop layer (CESL) disposed between the first gate SAC dielectric feature and the dielectric layer as well as between the second gate SAC dielectric feature and the dielectric layer. In some embodiments, the liner is in contact with the CESL.

In yet another of the embodiments, a method is provided. A method includes receiving a workpiece that includes a gate structure disposed in a first dielectric layer, a first spacer feature disposed between a first sidewall of the gate structure and the first dielectric layer, and a second spacer feature disposed between a second sidewall of the gate structure and the first dielectric layer. The method further includes selectively etching the gate structure, the first spacer feature and the second spacer feature to form a contact recess, depositing a liner over the workpiece, depositing a capping layer over the workpiece, removing a portion of the liner, depositing a contact etch stop layer (CESL) over the first dielectric layer, the liner, and the capping layer, depositing a second dielectric layer, forming a gate contact opening through the second dielectric layer, the CESL, the capping layer, and the liner to expose the gate structure, and depositing a gate contact in the gate contact opening. The composition of the capping layer is different from a composition of the liner.

In some embodiments, the method may further include, after the forming of the gate contact opening, recessing the liner to expose the first spacer feature and the second spacer feature in the gate contact opening. In some implementations, the method may further include after the depositing of the liner, depositing a hard mask material over the liner, selectively etching back the hard mask material such that a portion of the hard mask material remains between the first spacer feature and the second spacer feature, and selectively removing a portion of the liner in contact with the first dielectric layer, a top surface of the first spacer feature, and a top surface of the second spacer feature.

In some embodiments, the liner includes a thickness between about 1 nm and about 10 nm. In some implementations, the removing of the portion of the liner includes removing the portion of the liner over a top surface of the first spacer feature such that a top surface of the liner is substantially coplanar with the top surface of the first spacer feature. In some instances, the liner includes silicon oxide, hafnium silicide, silicon oxycarbide, aluminum oxide, zirconium silicide, aluminum oxynitride, zirconium oxide, hafnium oxide, hafnium zirconium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving a workpiece comprising:
a gate structure over a channel region,
a first dielectric layer over source/drain regions adjacent the channel region,
a first spacer feature disposed between a first sidewall of the gate structure and the first dielectric layer, and
a second spacer feature disposed between a second sidewall of the gate structure and the first dielectric layer;
selectively etching the gate structure, the first spacer feature and the second spacer feature to form a contact recess such that top surfaces of the first spacer feature and the second spacer feature are higher than a top surface of the gate structure;

depositing a liner over the workpiece;
removing a portion of the liner above top surfaces of the first spacer feature and the second spacer feature to expose the top surfaces of the first spacer feature and the second spacer feature;
after the removing of the portion of the liner, depositing a capping layer over the workpiece; and
planarizing the first dielectric layer and the capping layer to provide a planar top surface,
wherein the removing of the portion of the liner comprises:
depositing a hard mask layer over the liner,
selectively recessing the hard mask layer until a top surface of the hard mask layer is lower than the top surfaces of the first spacer feature and the second spacer feature, and
removing the hard mask layer.

2. The method of claim 1, further comprising:
selectively etching a portion of the first dielectric layer to form a source/drain contact opening adjacent the first spacer feature; and
forming a source/drain contact in the source/drain contact opening.

3. The method of claim 2, further comprising:
selectively recessing the source/drain contact without etching the capping layer or the first dielectric layer to form a recess; and
forming a self-aligned contact (SAC) dielectric layer in the recess.

4. The method of claim 3, further comprising:
depositing an etch stop layer over the first dielectric layer, the capping layer and the SAC dielectric layer; and
depositing a second dielectric layer over the etch stop layer
forming a gate contact opening through the second dielectric layer, the etch stop layer, the capping layer, and the liner to expose the gate structure; and
depositing a gate contact in the gate contact opening.

5. The method of claim 1, wherein a composition of the capping layer is different from a composition of the liner.

6. The method of claim 1, wherein the depositing of the liner comprises depositing the liner over a top surface and sidewalls of the first dielectric layer.

7. The method of claim 1,
wherein the first spacer feature and the second spacer feature comprise silicon oxycarbonitride,
wherein the liner comprises hafnium zirconium oxide.

8. The method of claim 1,
wherein, after the selectively etching, a top surface of the first dielectric layer is higher than the top surfaces of the first spacer feature and the second spacer feature,
wherein, after the depositing of the capping layer, the capping layer interfaces sidewalls of the first dielectric layer and the top surfaces of the first spacer feature and the second spacer feature.

9. A method, comprising:
receiving a workpiece comprising:
a gate structure over a channel region,
a first dielectric layer over source/drain regions adjacent the gate structure,
a first spacer feature disposed between a first sidewall of the gate structure and the first dielectric layer, and
a second spacer feature disposed between a second sidewall of the gate structure and the first dielectric layer;

selectively etching the gate structure, the first spacer feature and the second spacer feature to form a contact recess;

depositing a liner over the workpiece;

depositing a hard mask layer over the liner;

selectively recessing the hard mask layer until a top surface of the hard mask layer is lower than the top surfaces of the first spacer feature and the second spacer feature;

removing the hard mask layer;

after the removing of the hard mask layer, depositing a capping layer over the workpiece; and planarizing the first dielectric layer and the capping layer to provide a planar top surface.

10. The method of claim 9, further comprising:

selectively etching a portion of the first dielectric layer to form a source/drain contact opening adjacent the first spacer feature; and forming a source/drain contact in the source/drain contact opening.

11. The method of claim 10, further comprising:

selectively recessing the source/drain contact without substantially etching the capping layer or the first dielectric layer to form a recess; and forming a self-aligned contact (SAC) dielectric layer in the recess.

12. The method of claim 11, further comprising:

depositing an etch stop layer over the first dielectric layer, the capping layer and the SAC dielectric layer; and depositing a second dielectric layer over the etch stop layer forming a gate contact opening through the second dielectric layer, the etch stop layer, the capping layer, and the liner to expose the gate structure; and depositing a gate contact in the gate contact opening.

13. The method of claim 10, wherein the first spacer feature and the second spacer feature comprise silicon oxycarbonitride, wherein the liner comprises hafnium zirconium oxide.

14. The method of claim 10, wherein the hard mask layer comprises silicon oxide.

15. A method, comprising:

receiving a workpiece comprising:

a gate structure over a channel region, a first dielectric layer over source/drain regions adjacent the channel region, a first spacer feature disposed between a first sidewall of the gate structure and the first dielectric layer, and a second spacer feature disposed between a second sidewall of the gate structure and the first dielectric layer;

selectively etching the gate structure, the first spacer feature and the second spacer feature to form a contact recess;

forming a liner along sidewalls of the first spacer feature and the second spacer feature;

depositing a capping layer over the workpiece to directly contact sidewalls of the first dielectric layer and top surfaces of the first spacer feature and the second spacer feature;

depositing a contact etch stop layer (CESL) over the first dielectric layer and the capping layer;

depositing a second dielectric layer;

forming a gate contact opening through the second dielectric layer, the CESL, the capping layer, and the liner to expose the gate structure; and depositing a gate contact in the gate contact opening.

16. The method of claim 15, wherein a composition of the capping layer is different from a composition of the liner.

17. The method of claim 15, wherein the forming of the liner comprises:

after the selectively etching, conformally depositing a liner over the workpiece;

depositing a hard mask material over the liner;

selectively etching back the hard mask material such that a portion of the hard mask material remains between the first spacer feature and the second spacer feature; and selectively removing a portion of the liner in contact with the first dielectric layer, a top surface of the first spacer feature, and a top surface of the second spacer feature.

18. The method of claim 17, wherein the hard mask material comprises silicon oxide.

19. The method of claim 17, wherein the liner comprises a thickness between about 1 nm and about 10 nm.

20. The method of claim 15, wherein the first spacer feature and the second spacer feature comprise silicon oxycarbonitride, wherein the liner comprises hafnium zirconium oxide.

* * * * *